United States Patent
Hurwitz et al.

(10) Patent No.: US 11,600,966 B2
(45) Date of Patent: Mar. 7, 2023

(54) LIGHT SOURCE SYSTEM

(71) Applicant: Analog Devices International Unlimited Company, Limerick (IE)

(72) Inventors: Jonathan Ephraim David Hurwitz, Edinburgh (GB); David Neil, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 211 days.

(21) Appl. No.: 17/080,629

(22) Filed: Oct. 26, 2020

(65) Prior Publication Data

US 2021/0242661 A1 Aug. 5, 2021

Related U.S. Application Data

(63) Continuation-in-part of application No. 16/780,735, filed on Feb. 3, 2020, and a continuation-in-part of (Continued)

(51) Int. Cl.
*H01S 5/042* (2006.01)
*H01S 5/02325* (2021.01)
(Continued)

(52) U.S. Cl.
CPC ........ *H01S 5/0428* (2013.01); *H01S 5/02325* (2021.01); *H01S 5/02345* (2021.01); *H01S 5/02355* (2021.01); *H03K 17/6871* (2013.01)

(58) Field of Classification Search
None
See application file for complete search history.

(56) References Cited

U.S. PATENT DOCUMENTS

| 5,742,379 A | 4/1998 | Reifer |
| 6,414,974 B1 | 7/2002 | Russell et al. |

(Continued)

FOREIGN PATENT DOCUMENTS

| CN | 113206442 | 8/2021 |
| CN | 113206589 | 8/2021 |

(Continued)

OTHER PUBLICATIONS

Zbik, Mateusz, et al., "Charge-Line Dual-FET High-Repetition-Rate Pulsed Laser Driver", Applied Sciences, 9(7), 1289, (2019), 12 pgs.

(Continued)

*Primary Examiner* — Tuan N Nguyen
(74) *Attorney, Agent, or Firm* — Schwegman Lundberg & Woessner, P.A.

(57) ABSTRACT

The present disclosure relates to a light source system suitable for use in a time of flight camera. The light source system includes a light source, such as a laser, and a driver arranged to supply a drive current to the light source to turn the light source on to emit light. The driver includes two transistors coupled to the light source in series, such that when both transistors are turned on, a drive circuit is completed, current flows and the light source turns on. A very short pulse of light emission may be achieved efficiently by switching one of the transistors to the on-state to complete the drive circuit and a short time later turning off the other transistor in order to break the drive circuit. In this way, a pulse of light in the order of less than 1 nanosecond or less than 500 picoseconds may be achieved.

19 Claims, 17 Drawing Sheets

Related U.S. Application Data application No. 16/780,761, filed on Feb. 3, 2020, now Pat. No. 11,444,432.

(51) Int. Cl.
*H01S 5/02345* (2021.01)
*H01S 5/02355* (2021.01)
*H03K 17/687* (2006.01)

(56) References Cited

U.S. PATENT DOCUMENTS

| | | |
|---|---|---|
| 8,184,670 B2 | 5/2012 | Crawford et al. |
| 9,054,485 B1 | 6/2015 | Ng |
| 9,368,936 B1 | 6/2016 | Lenius et al. |
| 9,603,210 B1 | 3/2017 | Carlen |
| 9,711,934 B2 | 7/2017 | Wakabayashi et al. |
| 10,048,358 B2 | 8/2018 | Berger et al. |
| 10,256,605 B2 | 4/2019 | Gassend et al. |
| 10,270,527 B1 | 4/2019 | Mentovich et al. |
| 11,444,432 B2 | 9/2022 | Hurwitz et al. |
| 2008/0013646 A1 | 1/2008 | Hamada et al. |
| 2014/0204396 A1 | 7/2014 | Giger et al. |
| 2016/0358544 A1 | 12/2016 | Fu |
| 2017/0070029 A1 | 3/2017 | Moeneclaey et al. |
| 2017/0104416 A1* | 4/2017 | Kataoka .............. H03K 17/08 |
| 2017/0256538 A1* | 9/2017 | Lu .................... H01L 29/432 |
| 2018/0145482 A1 | 5/2018 | Lee et al. |
| 2018/0180978 A1 | 6/2018 | Yamada et al. |
| 2018/0278011 A1 | 9/2018 | Galvano et al. |
| 2018/0284242 A1 | 10/2018 | Campbell |
| 2018/0299536 A1 | 10/2018 | Marron et al. |
| 2018/0301872 A1 | 10/2018 | Burroughs et al. |
| 2019/0267911 A1 | 8/2019 | Lawson |
| 2019/0386460 A1 | 12/2019 | Barnes et al. |
| 2021/0239838 A1 | 8/2021 | Neil et al. |
| 2021/0242660 A1 | 8/2021 | Hurwitz et al. |
| 2021/0273405 A1 | 9/2021 | Neil et al. |

FOREIGN PATENT DOCUMENTS

| | | |
|---|---|---|
| CN | 113207207 | 8/2021 |
| DE | 102018120251 | 3/2019 |
| JP | 5509537 B2 | 4/2014 |
| JP | 2017003785 A | 1/2017 |
| WO | 2017003681 | 1/2017 |
| WO | 2018125825 | 7/2018 |
| WO | 2019167039 | 9/2019 |

OTHER PUBLICATIONS

"U.S. Appl. No. 16/780,735, Preliminary Amendment Filed Feb. 2, 2021", 8 pgs.

"Chinese Application Serial No. 202110148602.1, Notification to Make Rectification dated Mar. 26, 2021", w/o English translation, 2 pgs.

"Chinese Application Serial No. 202110148602.1, Response filed May 21, 2021 to Notification to Make Rectification dated Mar. 26, 2021", w/o English claims, 19 pgs.

"European Application Serial No. 21152618.1, Extended European Search Report dated Jun. 18, 2021", 10 pgs.

"European Application Serial No. 21152620.7, Extended European Search Report dated Jun. 22, 2021", 13 pgs.

"European Application Serial No. 21152619.9, Extended European Search Report dated Jun. 23, 2021", 9 pgs.

Hallman, Lauri, et al., "A High-Speed/Power Laser Transmitter for Single Photon Imaging Applications", IEEE Sensors, (2014), 1157-1160.

Hallman, Lauri, et al., "On Two-Dimensional Rangefinding Using ~1 nJ/~100 ps Laser Diode Transmitter and a CMOS SPAD Matrix", IEEE Photonics Journal, 10(4), (Aug. 2018), 13 pgs.

Kostamovaara, Juha, et al., "On Laser Ranging Based on High-Speed/Energy Laser Diode Pulses and Single-Photon Detection Techniques", IEEE Photonics Journal, 7(2), (Apr. 2015), 16 pgs.

U.S. Appl. No. 16/780,761, filed Feb. 3, 2020, Laser Driver Pulse Shaping Control.

U.S. Appl. No. 16/780,735, filed Feb. 3, 2020, Light Source System.

"U.S. Appl. No. 16/780,761, Non Final Office Action dated Dec. 15, 2021", 11 pgs.

"U.S. Appl. No. 16/780,761, Response filed Mar. 15, 2022 to Non Final Office Action dated Dec. 15, 2021", 9 pgs.

"U.S. Appl. No. 16/780,735, Non Final Office Action dated Jul. 28, 2022", 11 pgs.

\* cited by examiner

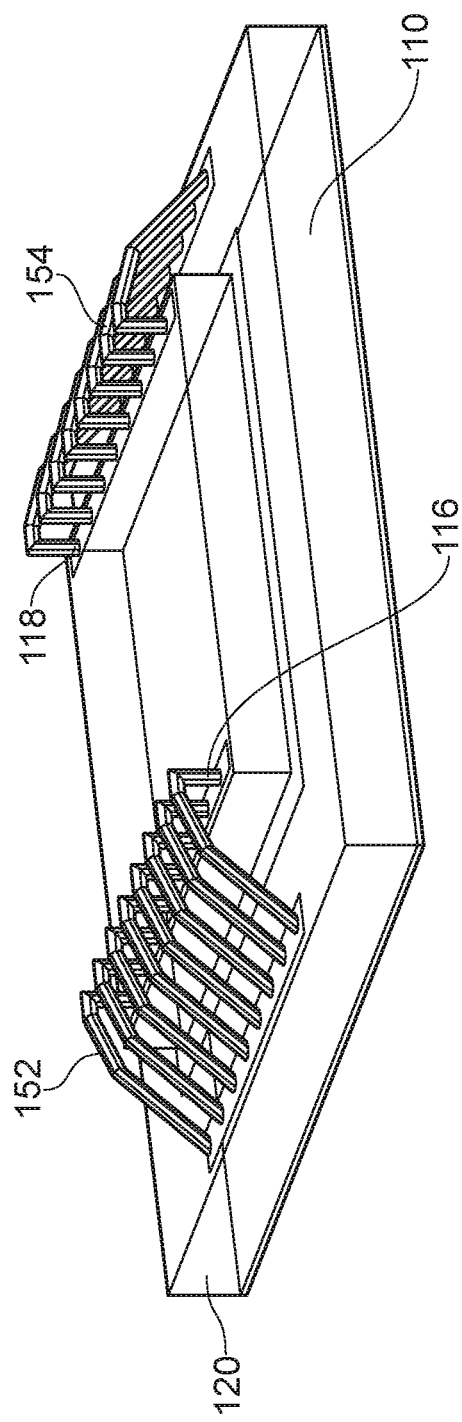
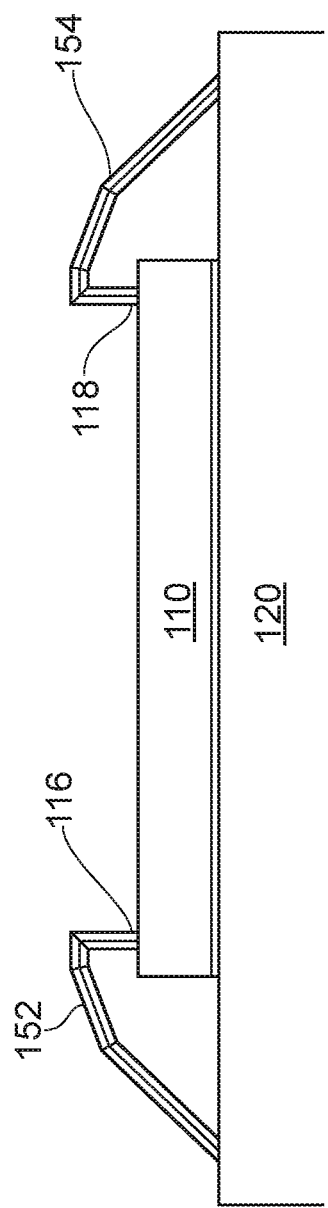
FIG. 2A
FIG. 2B

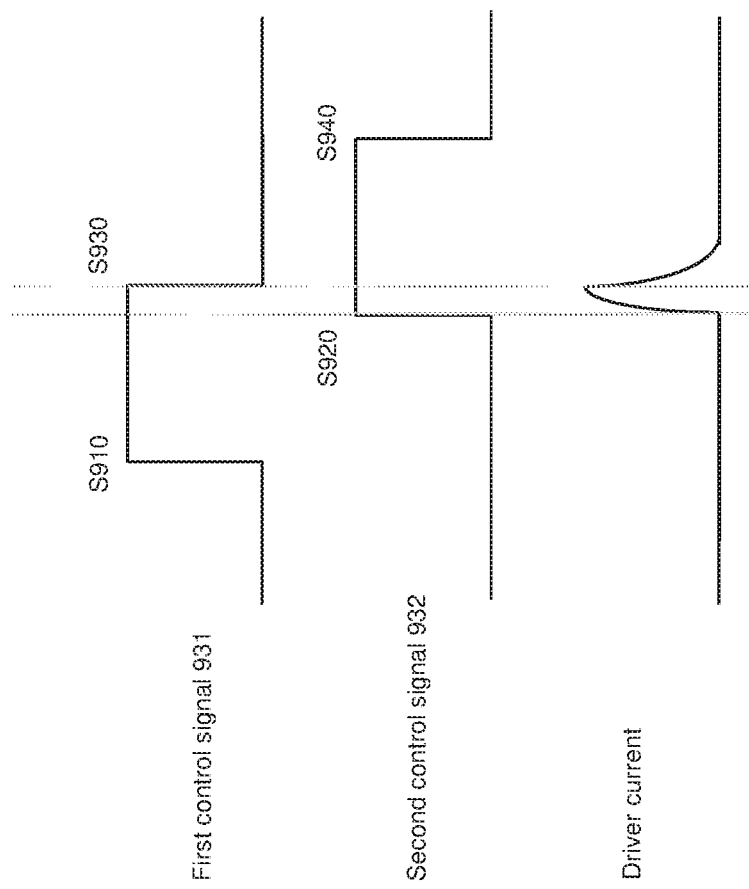

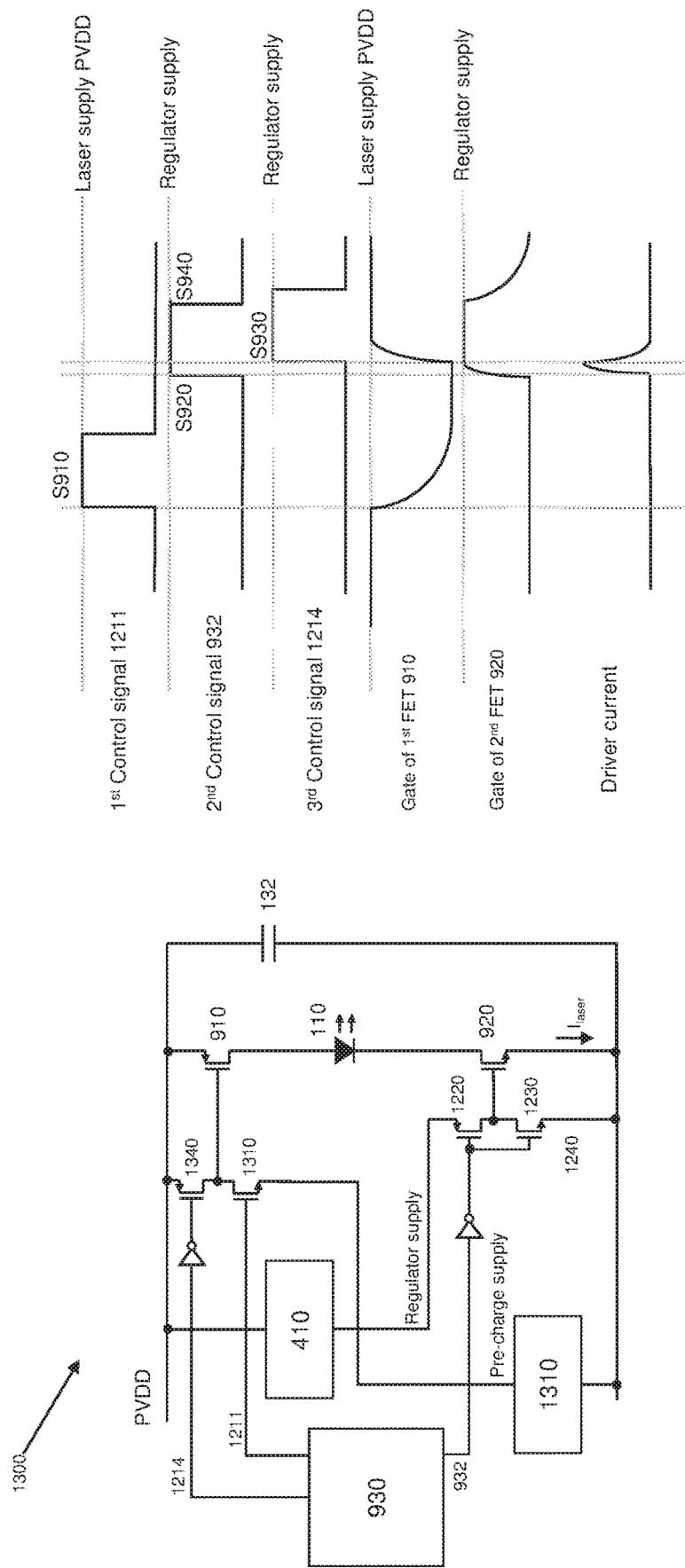

LIGHT SOURCE SYSTEM

CLAIM OF PRIORITY

This application is a continuation-in-part of U.S. patent application Ser. No. 16/780,761, filed Feb. 3, 2020 and a continuation-in-part of U.S. patent application Ser. No. 16/780,735, filed Feb. 3, 2020, the benefit of priority of each of which is claimed, and each of which are hereby incorporated by reference in its entirety.

TECHNICAL FIELD

The present disclosure relates to a light source system, which may be used, for example, as the light source in a time-of-flight camera system.

BACKGROUND

Time-of-flight (ToF) camera systems are range imaging systems that resolve the distance between the camera and an object by measuring the round trip time of a light signal emitted from the ToF camera system. The systems typically comprise a light source (such as a laser or LED), a light source driver to control the emission of light from the light source, an image sensor to image light reflected by the subject, an image sensor driver to control the operation of the image sensor, optics to shape the light emitted from the light source and to focus light reflected by the object onto the image sensor, and a computation unit configured to determine the distance to the object by determining the amount of time between an emission of light from the light source and a corresponding reflection from the object.

ToF camera systems may measure distances ranging from a few centimetres to 100s or 1000s of metres. Given the high speed of light, a time difference of only 16.66 ns between an emission of light and reception of reflected light corresponds to an object 2.5 m from the camera system. Therefore, ToF camera systems require high levels of temporal precision and control in order to measure distances accurately.

The present disclosure relates to a light source system suitable for use in a time of flight camera. The light source system includes a light source, such as a laser, and a driver arranged to supply a drive current to the light source to turn the light source on to emit light. The driver includes two transistors coupled to the light source in series, such that when both transistors are turned on, a drive circuit is completed, current flows and the light source turns on. A very short pulse of light emission may be achieved efficiently by switching one of the transistors to the on-state to complete the drive circuit and a short time later turning off the other transistor in order to break the drive circuit. In this way, a pulse of light in the order of less than 1 nanosecond or less than 500 picoseconds may be achieved. The duration of light emission may be shorter than the duration of current due to the turn on characteristics of the light source, for example because of the threshold level of a VCSEL.

The present disclosure also includes a light source system includes a light source, such as a laser, and a driver arranged to supply a drive current to the light source to turn the light source on to emit light. The driver includes a capacitor to store energy and then discharge to generate the drive current, and the driver is integrated into a semiconductor die on which the light source is mounted. Consequently, the driver includes within it the source of energy for the drive current and the light source and driver are very close together, meaning that the light source may be turned on and off very quickly with a relatively large drive current, in order to output a high optical power, short duration light pulse.

In a first aspect of the present disclosure there is provided a laser light source system comprising: a laser light source; a first transistor device coupled to the laser light source; a second transistor device coupled to the laser light source, wherein the first transistor device and second transistor device are arranged such that when both the first transistor device and the second transistor device are in an on-state, a laser drive circuit is complete and a laser drive current flows through the laser light source; and a controller arranged to control a state of the first switch and a state of the second switch, wherein the controller is configured to control a pulse emission of light from the laser light source by: a) switching on the first transistor device whilst the second transistor device is in an off-state; b) after switching on the first transistor device, turning on the laser light source by switching on the second transistor device such that both the first transistor device and second transistor device are in an on-state; and c) after switching on the second transistor device, turning off the laser light source by switching off the first transistor device.

The controller may be configured to turn off the laser light source by switching off the first transistor device whilst the second transistor device is still in the on-state.

The laser light source system may be further configured to: d) after switching off the first transistor device, resetting the laser light source system by switching off the second transistor device such that the first transistor device and the second transistor device are both in the off-state.

Switching on the first transistor may comprise: precharging the first transistor by applying a turn-on voltage to a control terminal of the first transistor to charge a capacitance associated with the control terminal of the first transistor, and removing the turn-on voltage applied to the control terminal of the first transistor such that the first transistor is held in the on-state by the capacitance associated with the control terminal of the first transistor.

The capacitance associated with the control terminal of the first transistor may be a parasitic capacitance of the first transistor.

The laser light source system may further comprise a pre-charge transistor for controlling the application of the turn-on voltage to the control terminal of the first transistor, and the controller may be configured to apply the turn-on voltage and remove the turn-on voltage by controlling the state of the pre-charge transistor.

Switching off the first transistor may comprise discharging the capacitance associated with the control terminal of the first transistor.

The laser light source system may further comprise a turn-off transistor for controlling the discharge of the capacitance associated with the control terminal of the first transistor, wherein the controller may be configured to discharge the capacitance associated with the control terminal of the first transistor by controlling the state of the turn-off transistor using a turn-off control signal.

The laser light source system may further comprise a cascode transistor in the capacitance discharge path.

A magnitude of the turn-on voltage may be greater than a magnitude of a laser drive voltage used to supply the laser drive current.

The laser light source system may further comprise a bootstrap capacitor, wherein a first plate of the bootstrap capacitor is coupled to the control terminal of the first transistor and a second plate of the bootstrap capacitor is coupled to the controller, and wherein the controller is further configured to apply, prior to switching on the second transistor device, a bootstrap voltage to the second plate of the bootstrap capacitor to increase a magnitude of a voltage at the control terminal of the first transistor to be greater than a magnitude of the turn-on voltage.

The controller may be configured to: generate a first control signal for controlling the state of the first transistor; and generate a second control signal for controlling the state of the second transistor, wherein the controller is configured to control a duration of the pulse emission of light from the laser light source by setting a time difference between a change in the second control signal causing the second transistor to turn on and a change in the first control signal causing the first transistor to turn off.

The controller may be configured to control the laser light source to emit the laser light pulse with a duration of less than 1 nanosecond, or less than 800 picoseconds, or less than 500 picoseconds, or less than 200 picoseconds.

The laser light source system may further comprise a discharge transistor coupled to the laser light source and arranged to create a discharge path approximately at the time of switching off the first transistor device (for example, at the same time as switching off the first transistor, or at a time shortly after switching off the first transistor device), so as to discharge parasitic charge associated with the laser light source.

In a second aspect of the present disclosure, there is provided a laser light source controller for coupling to a laser driver circuit that comprises a first transistor, a second transistor and a laser light source, wherein the laser light source controller is configured to: output a first control signal for controlling the first transistor; and output a second control signal to a second transistor that is coupled to the laser light source, wherein the first transistor, second transistor and laser light source are arranged in series such that when both the first transistor and second transistor are conducting, the laser light source turns on, wherein the laser light source controller is configured to control a pulse emission of light from the laser light source by: a) setting the first transistor to a conducting state using the first control signal whilst the second transistor device is in a non-conducting state; b) after setting the first transistor to the conducting state, turning on the laser light source by setting the second transistor to a conducting state using the second control signal such that both the first transistor device and second transistor device are conducting; and c) after setting the second transistor to the conducting state, turning off the laser light source by setting the first transistor to a non-conducting state.

The first control signal may be for switching the first transistor from the non-conducting state to the conducting state, and wherein the laser light source controller may be further configured to output a third control signal for switching the first transistor from the conducting state to the non-conducting state, wherein the laser light source controller is configured to set the first transistor to the non-conducting state using the third control signal.

The laser light source controller may be further configured to control a time difference between setting the second transistor to the conducting state and setting the first transistor to the non-conducting state based on a target light emission duration.

In a third aspect of the present disclosure, there is provided a method for controlling a pulse of emission of light from a laser light source comprising: setting a first transistor coupled in series with the laser light source to a conducting state whilst a second transistor coupled in series with the laser light source is in a non-conducting state; turning on the laser light source by setting the second transistor to a conducting state such that both the first transistor and second transistor are conducting; and turning off laser light source by setting the first transistor to a non-conducting state.

The method may further comprise, after setting the first transistor to a non-conducting state, setting the second transistor to a non-conducting state such that the first transistor and the second transistor are both in the non-conducting state.

A duration of the pulse emission of light from the laser light source may be set by a time difference between setting the second transistor to the conducting state and setting the first transistor to the non-conducting state. The duration of the light pulse may be shorter than the duration of the conduction time through the light source due to the turn on characteristics of the light source and due to parasitics that need to be charged in order to reach the light emission conditions of the light source.

A duration of the pulse emission of light from the laser light source may be less than 500 picoseconds, or less than 200 picoseconds.

In a fourth aspect of the present disclosure, there is provided a light source system comprising: a light source; and a semiconductor die comprising an integrated first driver, wherein the light source is mounted on the semiconductor die and the first driver is coupled to the light source and configured to control supply of a first drive current to the light source for controlling operation of the light source, wherein the first driver comprises a first capacitor for storing electrical energy for use in generating the first drive current.

The first driver may be configured to operate in: a charging state, during which the first capacitor stores charge received from a power supply; and an emission state, during which the first capacitor discharges to generate the first drive current, which is supplied to the light source to turn the light source on.

The first capacitor may be set to any suitable size (i.e., capacitance), depending on the size of first drive current required and/or the duration of first drive current required and/or the duty cycle ratio between charging state and emission state.

The first driver may further comprise a first switch configured to: during the emission state, close a first drive current circuit comprising the first capacitor and the light source to carry the first drive current between the light source and the first driver; and during the charging state, open the first drive current circuit during the charging state to stop the supply of first drive current to the light source.

The first switch may be coupled between a cathode terminal of the light source and a reference voltage of the first driver, and wherein the first capacitor is coupled between an anode terminal of the light source and the reference voltage of the first driver.

The light source system may further comprise a controller configured to control the first switch, so as to control switching of the first driver between the charging state and the emission state.

The first switch may comprise a first transistor, wherein the controller is configured to control operation of the first switch by controlling a first transistor driver signal at a gate/base terminal of the first transistor.

The light source system may further comprise a turn-on pre-driver, wherein the controller is configured to turn on the first transistor by applying a turn-on signal to the gate/base terminal of the first transistor using the turn-on pre-driver in order to transition the first driver from the charging state to the emission state.

The light source system may further comprise a voltage regulator coupled to the first capacitor and the turn-on pre-driver, wherein the voltage regulator is configured to: receive energy from the first capacitor; and supply a regulated voltage to the turn-on pre-driver at least during transition of the first driver from the charging state to the emission state.

The light source system may further comprise a turn-off pre-driver, wherein the controller is configured to turn off the first transistor by apply a turn-off signal to the gate/base terminal of the first transistor using the turn-off pre-driver in order to transition the first driver from the emission state to the charging state.

To transition the first driver from the emission state to the charging state, the controller may be configured to apply both the turn-on signal and the turn-off signal to the gate/base terminal of the first transistor for a first period of time, and then apply only the turn-off signal to the gate/base terminal of the first transistor for a second period of time.

The light source system may further comprise a photodetector arranged to detect light emitted from the light source, wherein the light source system is further configured to charge the first capacitor only if the photodetector detects light emitted from the light source during the preceding emission state.

The light source may comprise a laser, for example a vertical-cavity surface-emitting laser or a stacked edge emitting laser.

The light source may comprise at least one terminal of a first polarity on a first surface of the light source and at least one terminal of a second polarity on a second surface of the light source, wherein the first driver is coupled to the at least one terminal of the first polarity and the at least one terminal of the second polarity such that the first drive current can flow through the light source to turn on the light source.

The second surface of the light source may be affixed to a first surface of the semiconductor die, and wherein the first driver is coupled to the at least one terminal of the first plurality by a first plurality of bonding wires.

The light source may comprise a first terminal of a first polarity, a second terminal of the first polarity and at least one third terminal of a second polarity, and wherein the first driver is coupled to the first terminal and the third terminal such that the first drive current can flow between the first terminal and the third terminal to turn on the light source, and wherein the semiconductor die further comprises an integrated second driver coupled to the second terminal and the third terminal, wherein the second driver is configured to control supply of a second drive current to the light source such that the second drive current can flow between the second terminal and the third terminal to turn on the light source, wherein the second driver comprises a second capacitor for storing electrical energy for use in generating the second drive current.

The first terminal and the second terminal may be are arranged on the light source such that they are substantially symmetrical about a plane of symmetry, wherein the first driver and the second driver are arranged within the die such that they are substantially symmetrical about the plane of symmetry.

In a fifth aspect of the present disclosure, there is provided a time of flight camera system comprising: a light source system comprising: a light source for emitting light towards an object to be imaged; and a semiconductor die comprising an integrated first driver, wherein the light source is mounted on the semiconductor die and the first driver is coupled to the light source and configured to control supply of a first drive current to the light source for controlling operation of the light source, wherein the first driver comprises a first capacitor for storing electrical energy for use in generating the first drive current; and a photodetector for receiving light reflected from the object to the imaged.

In a sixth aspect of the present disclosure, there is provided a driver for coupling to a light source to drive the light source, the driver comprising: at least one capacitor for storing charge; a controllable switch for switching the driver between a charging state and an emission state; a turn-on pre-driver coupled to the controllable switch, wherein the turn-on pre-driver is configured for use in controlling the controllable switch when transitioning from the charging state to the emission state; and a voltage regulator coupled to the at least one capacitor and the turn-on pre-driver and configured to supply a regulated voltage to the turn-on pre-driver, wherein the driver is configured such that during the charging state the at least one capacitor stores charge and during the emission state the at least one capacitor dischargers to supply a drive current to the light source to turn the light source on.

The driver may be configured for coupling to a power supply such that during the charging state, the at least one capacitor stores charge received from the power supply.

DRAWINGS

Aspects of the present disclosure are described, by way of example only, with reference to the following drawings, in which:

FIG. 2A shows a view of the arrangement of the VCSEL 110 mounted on the semiconductor die 120 of the light source system of FIG. 1;

FIG. 2B shows a further view of the arrangement of the VCSEL 110 mounted on the semiconductor die 120 of the light source system of FIG. 1;

FIG. 11 shows an example representation of the control timing of the light source system of FIG. 9;

FIGS. 13A and 13B shows a representation and control timing of a further example implementation of the system of FIG. 9;

DETAILED DESCRIPTION

Figure 1:
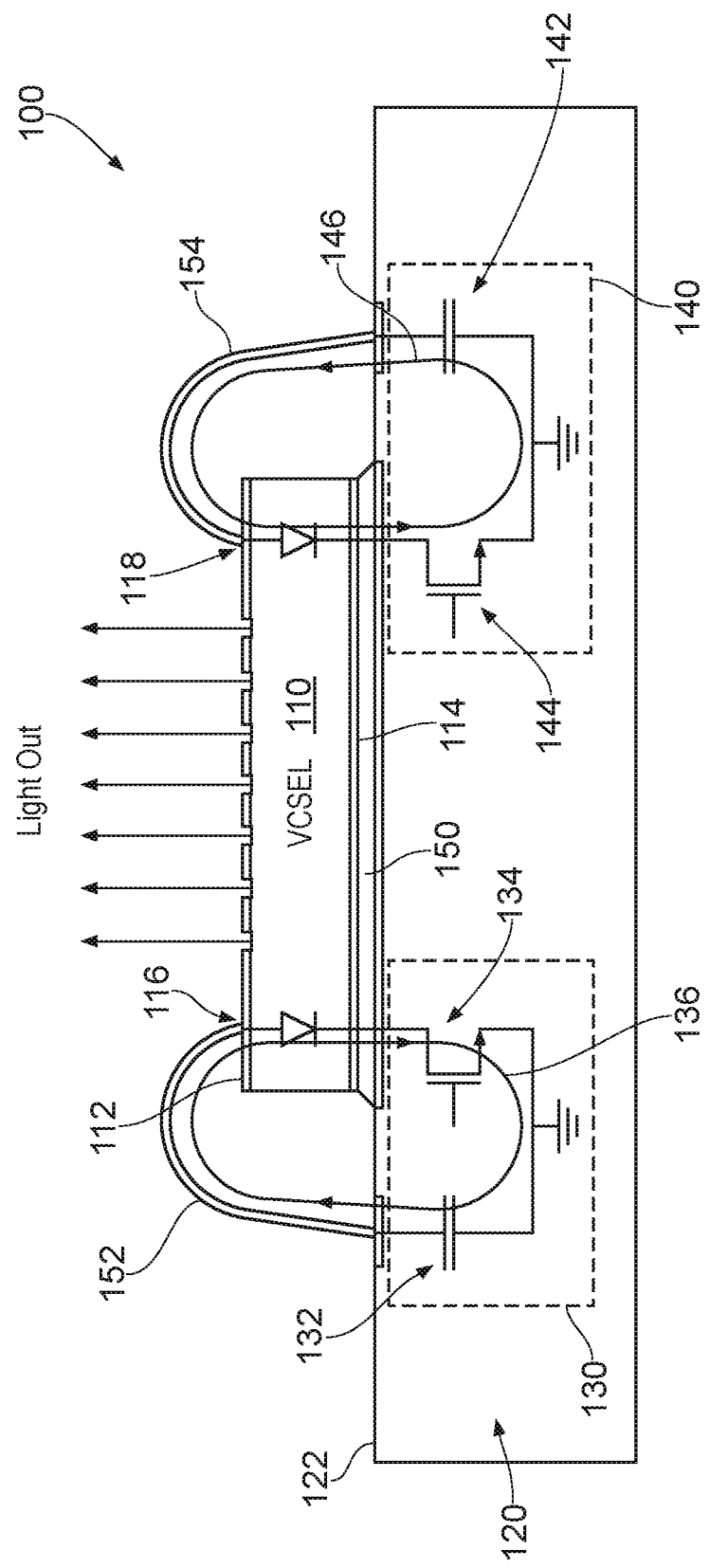
FIG. 1 shows an example representation of a light source system, in accordance with an aspect of the present disclosure.

Many factors may affect the precision with which a ToF camera system can measure distance to an object. One of those factors is the nature of the light emitted from the light source. The accuracy with which the system knows the moment of light emission may affect how accurately the system can determine distance to the object. For example, if the time difference between the moment the system believes it emitted light and the moment at which the reflected light was received is 20 ns, an object distance of about 3 m will be determined. However, if the emission of light actually took place about 0.4 ns after the system thought it took place, the true time difference between light emission and light reflection is in fact about 19.6 ns, which equates to an object distance of 2.94 m. For many safety critical applications, an error of this size may be significant.

The inventors have realised that if the light source is controlled to emit a very short pulse of light (in the order of 100 ps or less), the precision of the ToF camera system may be improved. A relatively long light emission pulse may render it unclear whether reflected light corresponds to photons emitted at the very start, middle or very end of the light emission pulse. To address this, more samples may be gathered to help de-convolve the shape of the laser, but this slows down the system and consumes more power. However, if the light emission pulse is very short, such as less than 100 ps, this represents a maximum uncertainty of 0.1 ns, which may be acceptable for most applications. Consequently, the time between emission of light and corresponding reflection of light may be measured with more certainty.

To achieve very fast turn on of the light source, the inventors have determined that a high current light source driving signal may be beneficial. Driving the light source with a relatively high, short duration current pulse should shorten the duration of the output light pulse, and increase the peak optical power output. The inventors have realised that this higher peak optical power may bring a further benefit in improving the precision of the ToF camera system. In particular, a number of safety regulations limit the average optical power emitted from ToF camera systems with no limit on the peak optical power output. By reducing the light emission duration, a system may emit higher optical power whilst staying within safety regulations. Emitting light with higher peak optical power may be beneficial for improving the range and precision of the ToF camera system.

However, there are many challenges in driving a light source to emit a very short, high optical power light pulse. A very short, high current driving signal may be required for driving the light source, which may put considerable demands on the power supply/source providing the driving current and may affect other electrical components that are also using that power supply. For example, if the ToF camera system is integrated in a mobile phone, drawing a relatively high current for a very short period of time, without affecting any other components or functionality of the mobile phone, may require a very high quality, costly power system within the mobile phone. Furthermore, if the ToF camera system operates with relatively high current pulses, if a system fault/failure develops, the relatively high currents may present a safety risk to the ToF camera system and/or nearby devices/components and/or operators of the ToF camera system.

In addition to this, to achieve such short light emission pulses, the laser source should be turned on and off rapidly and with precision. Inherent resistances and inductances in the light source driver circuits not only contribute to electrical losses (thereby increasing the amount of current needed to achieve a particular optical power output from the light source), but also slows circuit transitions between current levels, thereby slowing turn on and turn off. Furthermore, quickly switching control components such as transistors can be very challenging and can lead to significant additional power consumption.

With all of these challenges in mind, the inventors have devised a light source system that is suitable for use in ToF camera systems. In the light source system, the light source driver is integrated into a semiconductor die and includes a capacitor as the energy source for generating the current to drive the light source. The driver is designed such that the capacitor may be gradually charged using a relatively low current power supply/source, and then rapidly discharged to provide most, if not all, of the energy required for the current driving the light source. Furthermore, the light source is mounted on, or stacked on, the driver such that the physical distance between the driver and the light source is minimised. By minimising the distance between the driver and the light source, the physical length of the current path between the driver and the light source may be reduced, thereby reducing electrical resistance and inductance. Furthermore, by using a capacitor to supply the majority, if not all, of the energy required for the driver current, the physical size of the circuit loop carrying the driver current may be reduced compared with using a separate/external power unit, which even further reduces resistance and inductance. A further benefit of using a capacitor in this way is that if a system fault/failure develops, there is only a limited amount of energy available for generating the high current, which should improve overall device safety.

Additionally, the inventors have developed a circuit for controlling the turning on and off of the light source using two primary transistors in the current path of the driver current. The circuit is arranged so that if either transistor is turned off (non-conducting) the current path for the driver current is broken. In this way, to control a very short duration light pulse from the light source, the circuit may be controlled to turn on a first of the primary transistors, followed at a later time by turning on the second of the primary transistors at which time the current path will be completed and the light source turned off. A short period of time after that corresponding to the target duration for the light pulse, the first transistor is turned off, thereby breaking the current path and turning off the light source. By initiating the start of the light pulse by turning on one transistor and ending the light pulse a short time later by turning off a different transistor, there is no need to very quickly turn on and then turn off the same current path transistor. This reduces the power consumption associated with rapidly turning on and then turning off a transistor, thereby reducing the overall power consumption associated with emitting the light pulse. The duration of the light pulse may be shorter than the duration of the conduction time through the light source due to the turn on characteristics of the light source and due to parasitics that need to be charged in order to reach the light emission conditions of the light source FIG. 1 shows an example representation of a light source system 100, suitable for use in a ToF system, in accordance with an aspect of the present disclosure. The light source system 100 comprises a light source 110, in this example a vertical-cavity surface-emitting laser (VCSEL), and a semiconductor die 120, such as a CMOS silicon die, or a GaN die, or a GaAs die, etc. Throughout this disclose, the light source 110 shall typically be referred to as a VCSEL, although it will be appreciated that any other suitable type of light source may alternatively be used, such as other types of laser (for example, a stacked edge emitting laser) or any suitable type of LED.

The VCSEL comprises a first surface 112, from which light is emitted, and a second surface 114, which opposes the first surface 112. The first surface 112 comprises a first terminal 116 and a second terminal 118 both of a first polarity, the first polarity in this example being the anode of the VCSEL diode. The second surface 114 comprises one or more third terminals of a second polarity, the second polarity in this example being the cathode of the VCSEL diode. The VCSEL 110 is mounted on, or stacked on, the semiconductor die 120. The second surface 114 of the VCSEL 110 is mounted on a first surface 122 of the semiconductor die 120 and bonded to the first surface 122 of the semiconductor die 120 using bonding material 150 and electrical interconnects, in such a way as to form an electrical connection between the one or more third terminals of the VCSEL 110 and the first and second drivers 130 and 140. Any suitable bonding material 150 and bonding techniques may be used for this, for example an epoxy or eutectic bond.

The semiconductor die 120 comprises an integrated first driver 130 and an integrated second driver 140. The first driver 130 is configured to control supply of a first drive current 136 to the VCSEL 110 for controlling operation of the VCSEL 110 (i.e., for controlling light emission from the VCSEL 110). The second driver 140 is configured to control supply of a second drive current 146 to the VCSEL 110 for controlling operation of the VCSEL 110 (i.e., for controlling light emission from the VCSEL 110). The first driver 130 comprises a first switch 134, which in this example is a first FET, for controlling the flow of the first drive current 136, and the second driver 140 comprises a second switch 146, which in this example is a second FET, for controlling the flow of the second drive current 146. The first driver 130 is electrically coupled to the first terminal 116 of the VCSEL 110 by one or more first bond wires 152 (although alternatively any other suitable form of electrical coupling may be used, for example depending on the design of the VCSEL 110). The second driver 140 is electrically coupled to the second terminal 118 of the VCSEL 110 by one or more second bond wires 154 (although alternatively any other suitable form of electrical coupling may be used, for example depending on the design of the VCSEL 110). When a sufficiently large first drive current 136 and/or second drive current 146 flows through the VCSEL 110, the VCSEL 110 will turn on and be excited to lase and therefore emit light. When no drive current, or insufficient drive current, flows through the VCSEL 110, no light should be emitted and the VCSEL is effectively turned off. Further details of the operation of the first driver 130 and the second driver 140 shall be given later in this disclosure.

FIGS. 2A and 2B show different views of the arrangement of the VCSEL 110 mounted on the semiconductor die 120. As can be seen, in this example there are eight first bond wires 152 and eight second bond wires 154, although any number of first bond wires 152 and second bond wires 154 may be used (for example, one, two, three, etc). It may be preferable to use the largest number of first bond wires 152 and second bond wires 154 possible for a given size of first terminal 116 and second terminal 118. By doing so, resistance for the first drive current 136 and the second drive current 146 may be minimised, thereby improving the power efficiency of the light source system 110 and maximising the amount of drive current delivered to the VCSEL 110.

Figure 3:
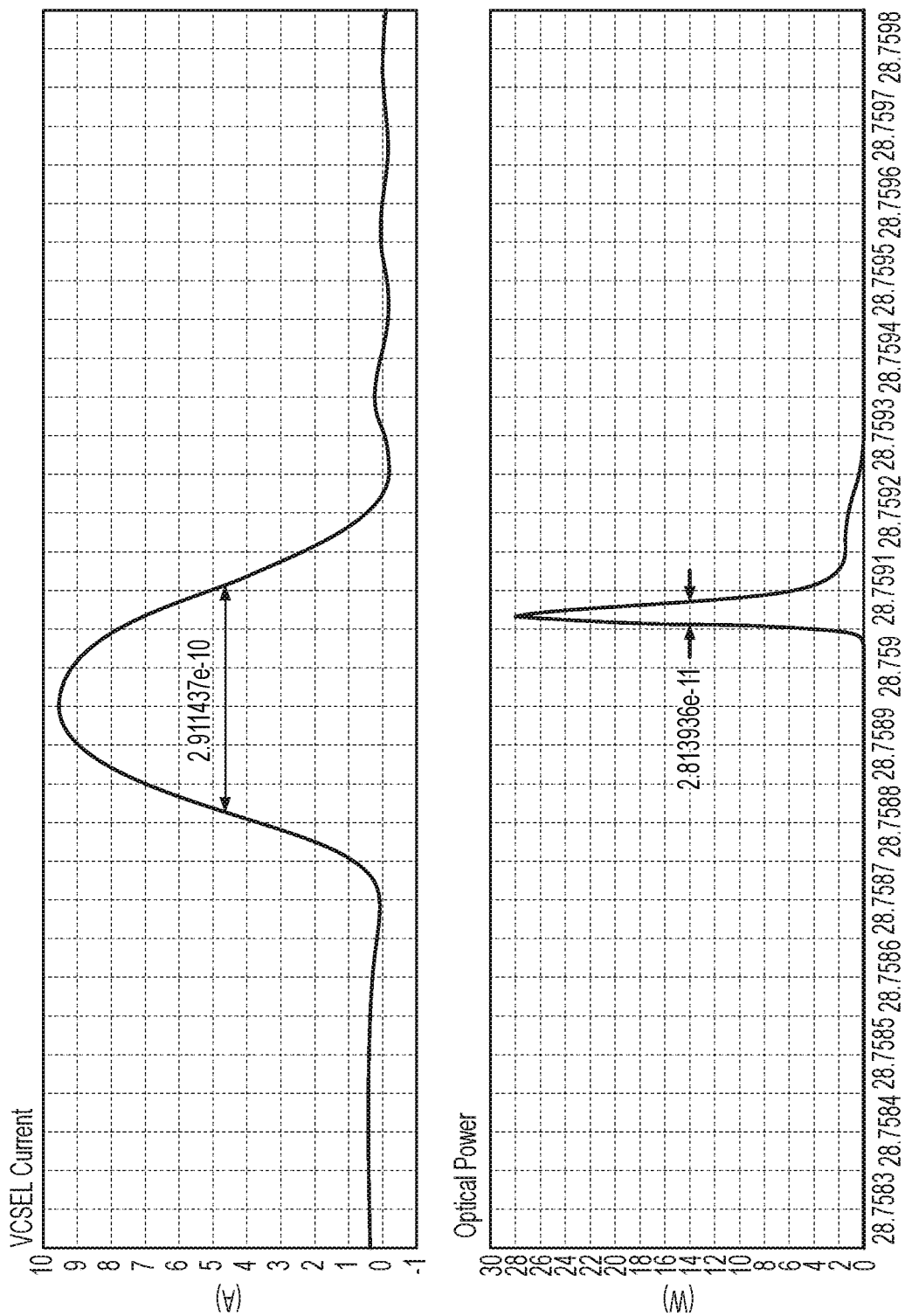
FIG. 3 shows an example graph representing a drive current for the VCSEL and optical power of light output from the VCSEL of the light source system of FIG. 1.

FIG. 3 shows graphs representing drive current (labelled VCSEL Current) and optical power of light output from the VCSEL 110. It can be seen that in this example, a drive current pulse duration of about 290 ps may be created by the drivers 130, 140, which may excite a light pulse emission from the VCSEL 110 with an effective duration of about 30 ps. It will be appreciated that the drive current pulse duration is longer than the light pulse duration largely as a consequence of lasing delays in the VCSEL 110. It will also be appreciated that this is merely one non-limiting example of drive current and light pulse duration, and that the light source system 100 may be configured to operate with different durations.

It may be counterintuitive to mount the VCSEL 110 on the integrated driver circuits 120, particularly when the drive currents are intended to be relatively high (for example, >1 A, or >3 A, or >5 A, or >8 A, or >10 A) owing to thermal dissipation difficulties. The VCSEL 110 and the drivers 130 and 140 are likely to generate significant heat when the drive currents are flowing, which should ideally be quickly and effectively dissipated in order to avoid device damage and degradation. It might have been expected that stacking the VCSEL 110 on top of the integrated drivers 130 and 140 would be likely to make heat dissipation considerably more difficult.

However, the inventors have recognised that by mounting the VCSEL 110 on the semiconductor die 120 which includes the integrated drivers 130, 140, the physical distance between the VCSEL 110 and the drivers 130, 140 may be minimised. Consequently, a first drive current circuit formed by the VCSEL 110, the first capacitor 132 and the first switch 134 to carry the first drive current 136 may be significantly smaller than other arrangements (for example, arrangements where the VCSEL 110 and the first driver 130 are mounted side-by-side on a PCB substrate with bonding wires carrying current both to and from the VCSEL 110). Likewise, the same is also true of the size of the second drive current circuit formed by the VCSEL 110, the second capacitor 142 and the second switch 144. This reduction in the size of circuits carrying the relatively high drive currents may reduce the resistance and inductance of the circuit, which may reduce circuit losses and increase the speed with which the drive currents, and therefore the VCSEL 110, can be turned on and off. This enables the drive currents to be generated as a very short duration pulse, resulting in a very short duration pulse of light from the VCSEL 110. The duration of the light pulse may be shorter than the duration of the conduction time through the light source due to the turn on characteristics of the light source and due to parasitics that need to be charged in order to reach the light emission conditions of the light source. Thus, by implementing the stacking arrangement represented in FIGS. 1, 2A, 2B, a shorter duration (for example <200 ps, or <150 ps, or <100 ps, or <80 ps, or <50 ps), higher optical power pulse of light may be output by the VCSEL 110. As explained earlier, in order to achieve this relatively short duration optical output from the VCSEL 110, a slightly longer duration drive current pulse may be required, for example to achieve a 30 ps light pulse, a 300 ps duration first drive current 136 may be required.

Not only may this improve the precision of a ToF system that uses the light source system 100, it has unexpectedly been realised that because of the short duration of current achieved by this arrangement, heat dissipation may not in fact be as significant a problem as might initially have been thought. ToF systems may operate by emitting light for a period of time and then turning off for a period of time. For example, a typical light emission duration for a SPAD direct ToF system may be a pulse duration of about 1-3 ns every 0.2 ps, representing a duty cycle ratio of about 1:100 for light emission:no light emission. A typical light emission duration of a continuous wave (CW) indirect ToF system may be about 100-200 ns every 2 ms, representing a duty cycle ratio between about 1:20 to 1:10. However, in the present disclosure, because such a short, high optical power light pulse has been achieved, a duty cycle of at least 1:1,000, such as 1:5,000, or 1:10,000, may be implemented. For example, the approximately 30 ps light pulse represented in FIG. 3 corresponds to a duty cycle ratio of about 1:30,000. Consequently, there is a relatively very long period of time during which heat is not being generated by the light source system 100, during which time the heat generated during the emission part of the cycle may gradually dissipate into the surrounding environment and into the body of the die (and any other material coupled to the die).

The VCSEL 110 in the example represented in FIGS. 1, 2A and 2B has two terminals 116 and 118 of the same polarity, arranged to be substantially symmetrical about a plane of symmetry. In this example, the plane of symmetry extends perpendicular to the first and second surfaces 112, 114 of the VCSEL 110, roughly through the middle of the first and second surfaces 112, 114, such that the first terminal 116 is on one side of the plane of symmetry and the second terminal 118 is its mirror image on the other side of the plane of symmetry. The inventors have realised that it is possible to layout within the die 120 the components of the first driver 130 and the second driver 140 in such a way that they are substantially, or approximately, symmetrical about the plane of symmetry (as represented in FIG. 1). Consequently, the direction of the path/loop of the first drive current 136 is substantially opposite to that of the second drive current 146 (for example, the path of the first drive current 136 may be clockwise and the path of the second drive current 146 may be anticlockwise). As a result of this, EM radiation generated by one of the current paths/loops may be substantially, or at least partially, cancelled by EM radiation generated by the other current path/loop, particularly at far-field. Thus, RF emissions from the light source system 100 (caused by the light source system 100 generating pulses of light at RF frequencies) may be reduced and kept acceptably low, even when the drive currents are relatively high. This means that the light source system 100 should not negatively affect other nearby electrical devices/components, or breach RF emissions legislation. It will be appreciated that whilst this symmetrical arrangement may have benefits, such an arrangement is not essential and the first driver 130 and second driver 140 may be relatively arranged in any other suitable way.

Figure 4:
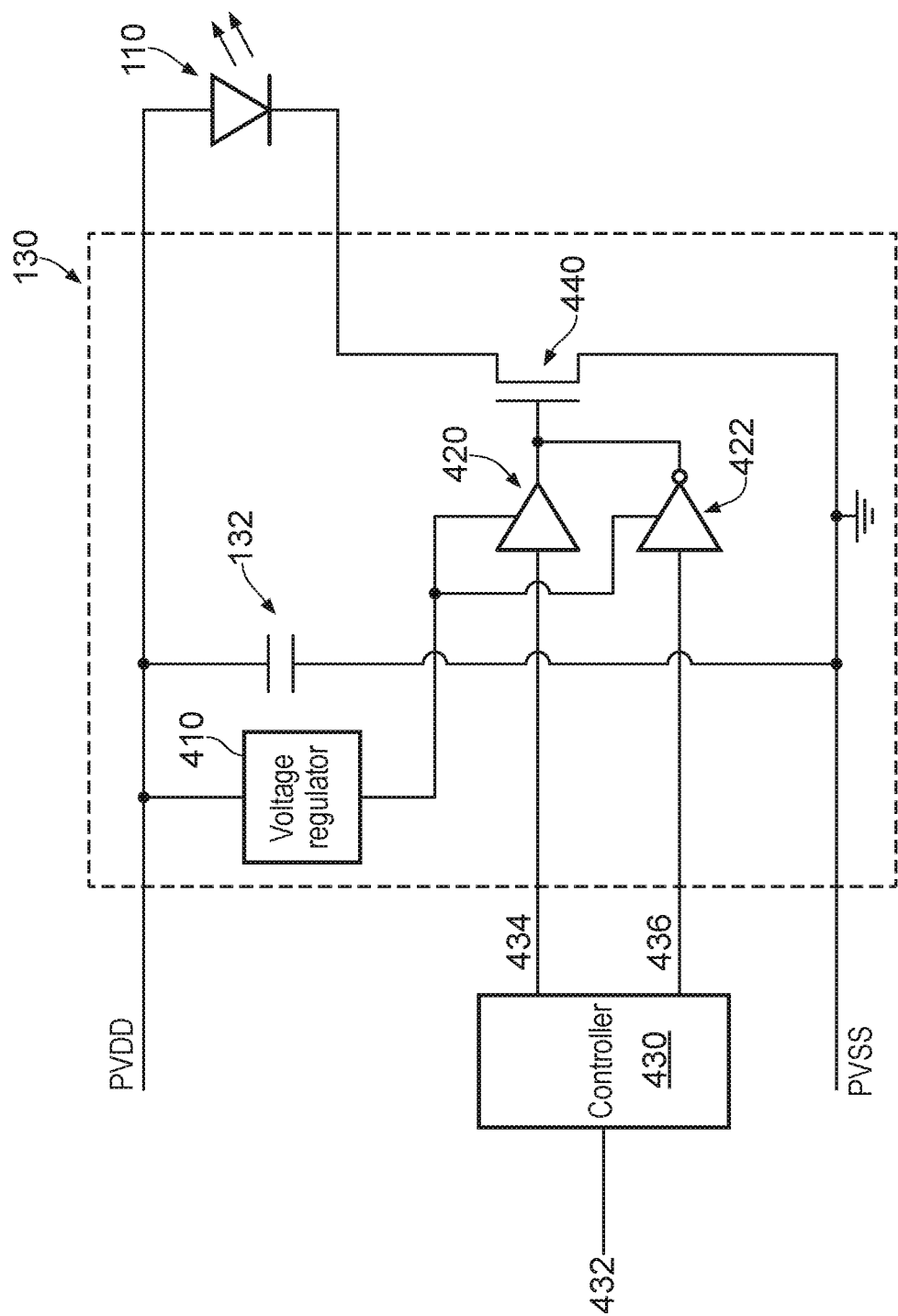
FIG. 4 shows a schematic representation of details of an example implementation of the light source system of FIG. 1.

FIG. 4 shows a schematic representation of example details of the light source system 110. The representation provides further details of an example implementation of the first driver 130, to help explain the operation of the first driver 130 in order to control supply of the first drive current 136 to the VCSEL 110. In this example, the first driver 130 further comprises a voltage regulator 410 (which may be implemented in any suitable way known to the skilled person), a turn-on pre-driver 420, a turn-off pre-driver 422 and a FET 440 which acts as the first switch 134. The light source system 110 also comprises a controller 430 configured to control switching of the first driver 130 between a charging state and an emission state. The controller 430 may be implemented in any suitable way, for example as logic integrated within the semiconductor die 420 or elsewhere, or using a microcontroller configured to operate as described below, or any other form of processor suitably configured to operate as described below. Likewise, the turn-on pre-driver 420 and turn-off pre-driver 422 may be implemented in any suitable way known to the skilled person, for example as buffers and/or digital buffers and/or amplifiers.

The first driver 130 is coupled to a power supply/source PVDD and PVSS, which may be a relatively low current power supply (for example, the first driver circuit 130 may draw less than 50 mA, or less than 30 mA, such as a typical average current of less than 20 mA, from the power supply). When the first driver 130 is in the charging state, the FET 440 is switched off (i.e., the first switch 134 is open), such that the current flowing through the VCSEL 110 is 0 A, or substantially 0 A (i.e., sufficiently low that there is no risk of the VCSEL 110 emitting any light). The power supply may be any suitable power supply to which the first driver 130 may be coupled. For example, if the light source system 100 is included as part of a larger device/system (such as a mobile device), the power supply may be the power supply of that larger device system (such as the battery of the mobile device). During the charging state, the first capacitor 130 is gradually charged by the power supply.

When a light pulse emission is desired, the first driver 130 may be transitioned from the charging state to the emission state. To control this transition, the controller 430 may use control lines 434 and/or 436 to control operation of the FET 440. For example, the controller 430 may receive an instruction via its input line 432 (which may take any suitable form, for example it may be an LVDS differential signal) to start a light pulse emission from the VCSEL 110. The controller 430 may then drive the control line 434 so that the turn-on pre-driver 420 applies a turn-on signal to the gate of the FET 440 in order to turn on the FET 440 (i.e., close the first switch 134). In this example, the turn-on signal is a voltage signal that exceeds the turn-on threshold voltage of the FET 440. The turn-on pre-driver 420 is used in this example because the first drive current 136 that will flow through the FET 440 when it is turned on should be relatively large (for example, between about 5 A and 12 A, such as >8 A, or >10 A), so the FET 440 should be a relatively high power FET 440. Most controllers may not be capable of supplying a sufficiently large drive signal to the FET 440 to turn it on, or at least may not be capable of supplying a sufficiently large drive signal to turn the FET 440 on quickly enough to achieve a quick transition from off to on. Therefore, the turn-on pre-driver 420 effectively functions to increase the signal set by the controller 430 on the control line 434 to a level sufficient to drive the FET 440 to turn on quickly.

In this arrangement, the power drawn by the turn-on pre-driver 420 and turn-off pre-driver 422 is supplied by the voltage regulator 410, which in turn draws the majority, if not all, of its power from the capacitor 132 discharging. By arranging it in this way, most, if not all, of the current required to switch the first driver 130 between the charging and emission states is kept within the first driver 130 and is not drawn from elsewhere, such as the power supply PVDD and PVSS. Some of the benefits of drawing the majority, if not all, required energy from the capacitor 132, rather than external sources, is explained earlier with reference to the first drive current 136 Furthermore, if the voltage regulator 410 and the pre-drivers are also integrated into the die 120, they may all be relatively close to each other and to the capacitor 132, further increasing switching speed and reducing losses.

When the FET 440 is turned on (i.e., the first switch 134 is closed), the first driver 130 is in the emission state and the first drive current circuit is closed such that the first drive current 136 flows between the VCSEL 110.

It can be seen that in this example arrangement of the first driver 130, the first capacitor 132 is coupled between an anode terminal of the VCSEL 110 and a reference voltage (ground in this example, but the reference voltage could alternatively be any other suitable voltage level) of the first driver 130 (i.e., one terminal of the capacitor 132 is coupled to the VCSEL 110 and the other terminal of the capacitor 132 is coupled to the reference voltage). Whilst this particular configuration is not essential, it has a benefit that the VCSEL 110 can be driven by positive voltages within the first driver 130, such that driving the VCSEL 110 does not require the generation of negative voltages within the first driver 130. This may be beneficial to simplify operation of the first diver 130 and enables the components of the first diver 130 to be integrated in the semiconductor die 120 using, for example junction isolation, and not require dielectric isolation.

Figure 5:
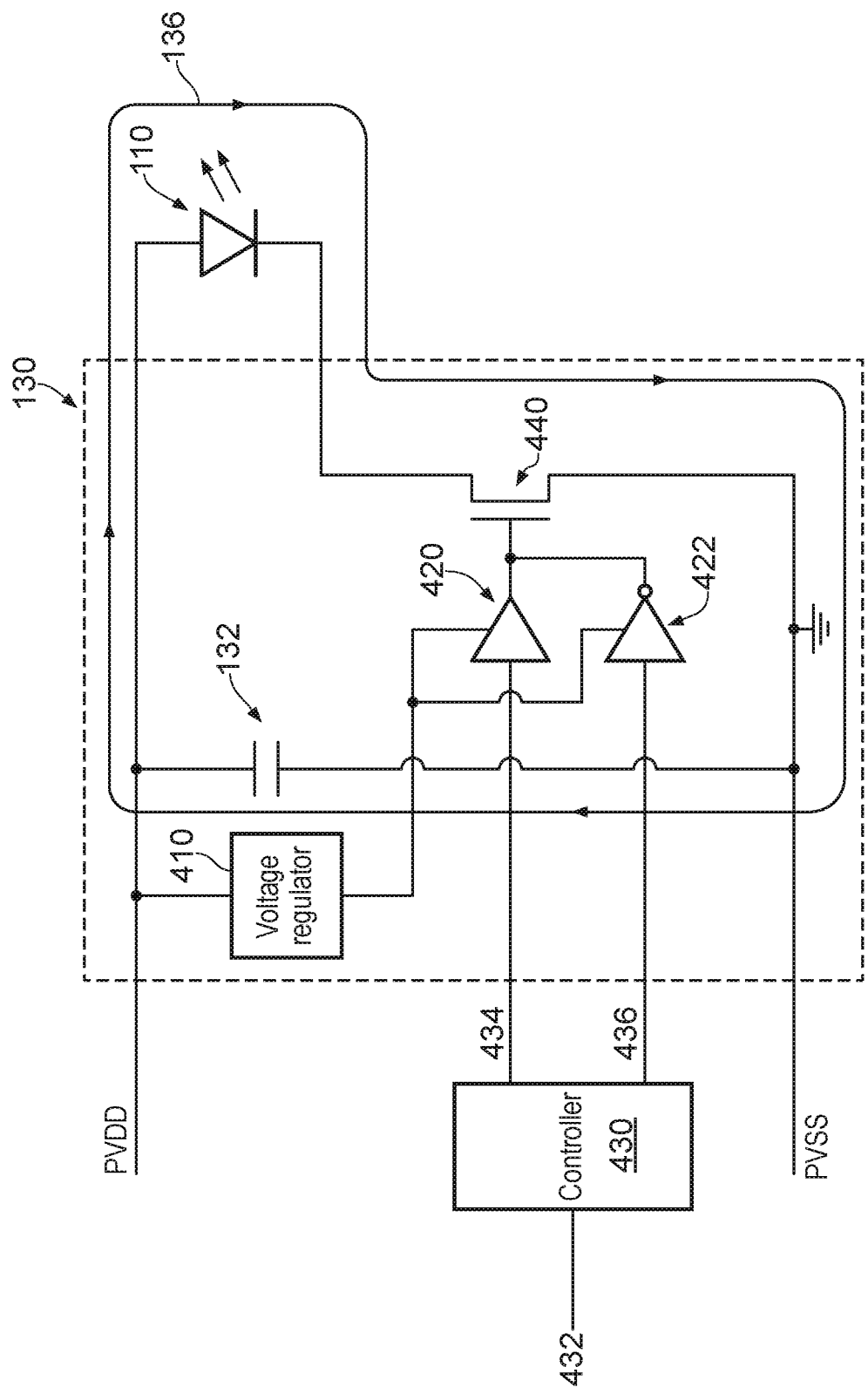
FIG. 5 shows an example representation of the first drive current generated by the first driver represented in FIG. 4.

FIG. 5 shows an example representation of first drive current 136 flowing through the first drive current circuit. During the emission state, the first capacitor 132 discharges to generate the first drive current 136. Consequently, the majority, if not all, of the energy required for the first drive current 136 is supplied by the first capacitor 132 during the drive time, such that the draw on the power supply PVDD and PVSS is very low (for example <5%, or <1%, of the first driver current 136 may be drawn from the power supply), if not effectively zero. As such, the majority, if not all, of the first drive current 136 is kept within the first driver 130 (i.e., no current, or no significant current, is drawn from sources elsewhere), within a relatively small first drive current circuit. In one alternative implementation, a further switch may be used to isolate the first driver 130 from the power supply when the first diver 130 is in the emission state, although in most implementations this should not be necessary since the first capacitor 130 provides so much energy during the emission state that the draw on the power supply is insignificant.

By utilising the first capacitor 132 in this way, the first capacitor 132 may be gradually, slowly charged by the power supply during the charging state, which should not affect the power supply in any significant way. The first capacitor 132 may then discharge to generate the first drive current 136 such that the power supply may be effectively, or entirely, unaffected by the relatively high first drive current 136. Consequently, it may be possible for the power supply to be of a standard specification, thereby minimising costs, and may be used by other components/systems without being affected by the light source system 100. Furthermore, because the first drive current 136 is generated effectively entirely by the integrated first capacitor 132 acting as a source of power, the first current driver circuit is kept relatively small (compared with the case where the first drive current 136 is drawn from an external power supply), which reduces delays in the first drive current 136 commencing and increases the speed of operation.

During the emission state, the first driver 130 may be configured such that the first capacitor 132 may be completely, or only partially, discharged in the process of generating the first drive current 136. In some implementations, generating the first drive current 136 may result in only a partial discharge of the charge stored on the first capacitor 132, such that the voltage across the first capacitor 132 is reduced (for example, by a few volts), but there is still a non-zero voltage across the first capacitor 132 at the end of the emission state. In this case, the voltage across the capacitor 132 may be monitored before, during and/or after the emission state, such that the amount of first drive current 136 supplied to the VCSEL 110 during the emission state may be determined. The size of the first capacitor 132 may be set to any suitable value depending on the amount of voltage headroom desired (i.e., the desired voltage across the capacitor at the end of the emission state) and/or the voltage of the power supply PVSS and PVDD and/or the desired first drive current level and/or the duration of the first drive current and/or the duty ratio of emission state to charging state. By way of non-limiting example, if a first drive current 136 of about 10 A is desired, for a first drive current duration of about 300 ps, with a desired reduction of voltage across the first capacitor 132 during the emission state of about 3V, the first capacitor 132 may have a capacitance of about 3 nF.

Furthermore, because the capacitor 132 can store only a finite amount of energy, if there is a fault or failure in the system, the relatively high first driver current 136 can only be sustained for a finite, relatively short, period of time. Consequently, the light source system 100 may have improved safety, compared with other devices that draw drive current from a less limited supply.

In order to transition the first driver 130 from the emission state to the charging state, the FET 440 is turned off (i.e., the switch 134 is opened), thereby opening the first drive current circuit and stopping the first drive current 136 from flowing through the VCSEL 110. To control this transition, the controller 430 may use control lines 434 and/or 436 to control operation of the FET 440. For example, the controller 430 may receive an instruction via its input line 432 to stop a light pulse emission from the VCSEL 110. The controller 430 may then set control line 434 to a level that will turn off the FET 440, for example to a voltage that is below the turn-on threshold voltage of the FET 440. The controller 430 may also apply a turn-off signal to the gate of the FET 440 using the turn-off pre-driver 422, which may be designed to have a very high drive strength and speed in one direction (i.e., pulling down the gate of the FET 440). For example, because in this implementation the turn-off pre-driver 422 is an inverting type pre-driver, the controller 430 may set the voltage at control line 436 to a 'high' voltage (eg, 3.3V, or 5V), resulting in the output of the turn-off pre-driver 422 going 'low' (eg, to 0V). Using the turn-off pre-driver 422 in this way, the speed with which the relatively high current FET 440 may switch off may be improved. The inventors have recognised that whilst this control of the turn-on pre-driver 420 and the turn-off pre-driver 422 may take place at the same time and a relatively fast turn off speed can be achieved for the FET 440, an even faster turn-off speed may be achieved by applying the turn-off signal to the gate of the FET 440 first (such that both the turn-on signal and turn-off signal are applied to the gate of the FET 440 for a first period of time) and then subsequently removing the turn-on signal such that then only the turn-off signal is applied to the gate terminal of the FET 440 for a second period of time. This effect may be particularly realised when the turn-off pre-driver 422 is designed to have a relatively high drive strength compared with the drive strength of the turn-on pre driver 420, which results in the turn-off pre-driver 422 overdriving the turn-on pre-driver 420. The superior drive strength of the turn-off pre-driver 422 may thus result in pulling down the gate of the FET 440 faster than could otherwise be achieved. It may be counter intuitive to drive the gate of the FET 440 with both the turn-on and turn-off signal for a first period of time in order to turn off the FET 440, but the inventors have nevertheless realised that such driving may increase the turn off speed of the FET 440.

It will be appreciated that each of the turn-on pre-driver 420 and the turn-off pre-driver 422 may be inverting or non-inverting type and the signals applied by the controller 430 to the control lines 434 and 436 set accordingly. Furthermore, it will be appreciated that the turn-off pre-driver 422 is optional and in an alternative it may be omitted entirely, with the FET 440 being turned off merely by changing the voltage applied to its gate so that it is below the turn-on threshold of the FET 440.

Figure 6:
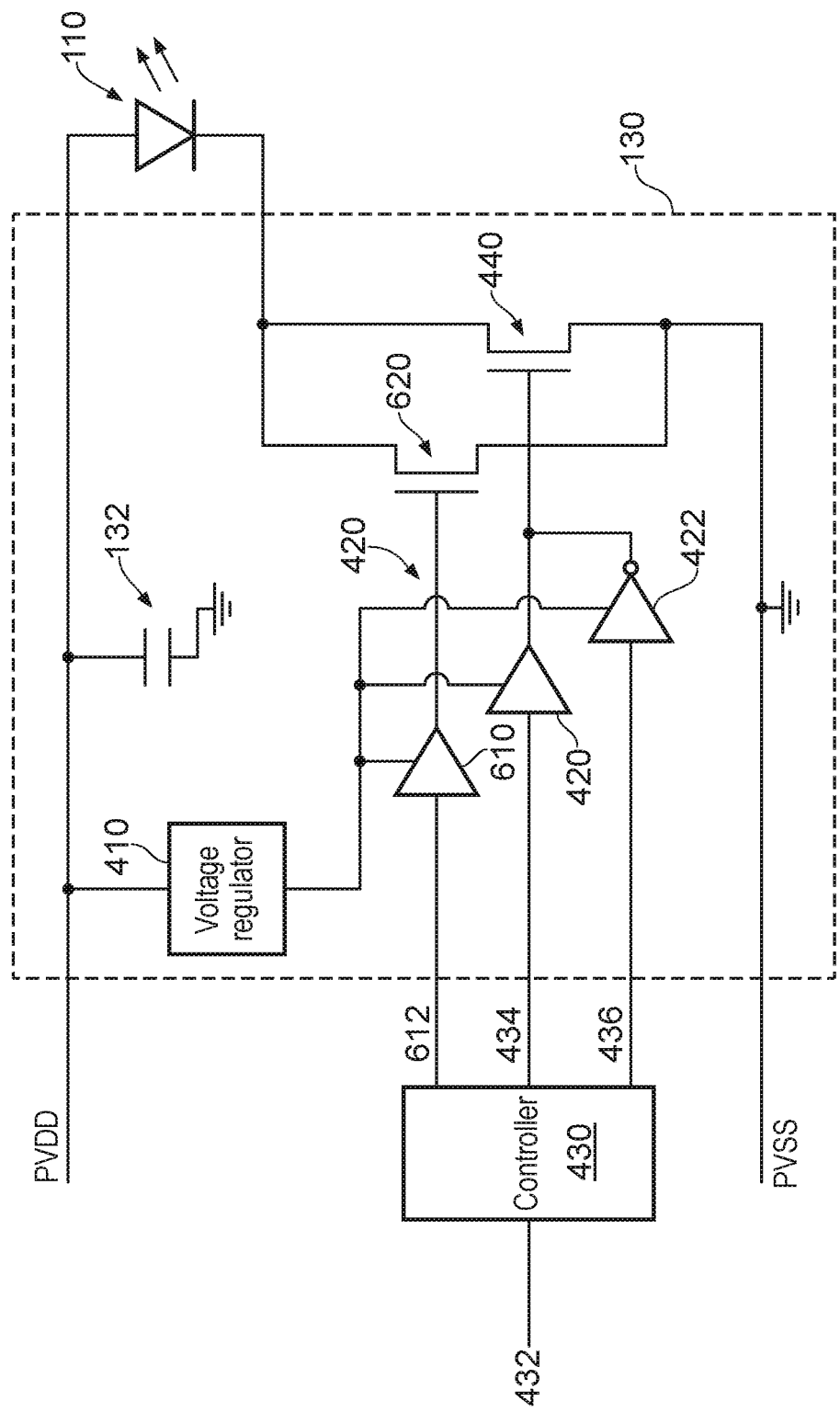
FIG. 6 shows a schematic representation of details of a further example implementation of the light source system of FIG. 1.

FIG. 6 shows an example alternative implementation of the first driver 130. This implementation is similar to that represented in FIGS. 4 and 5, but includes an additional turn-on pre-driver driver 610, an additional control line 612 from the controller 430 and an additional FET 620. The FET 620 is a relatively low current FET (for example, rated at around 400 mA, compared with about 10 A for the FET 440) and acts as a VCSEL pre-bias, to enable a relatively low, sub-lasing threshold, current to flow through the VCSEL 110 before the VCSEL 110 is fully turned on by the FET 440. As such, prior to desiring the turn-on of the VCSEL 110, the controller 612 may apply a turn-on voltage to the gate of the additional FET 620 (i.e., a voltage exceeding the turn-on threshold voltage of the additional FET 620) using the additional turn-on pre-driver 620. Once the additional FET 620 is turned on, a relatively low current may flow through the additional FET 620 (for example, about 400 mA). Because the current is relatively low, and below the lasing threshold of the VCSEL 110, the VCSEL 110 will not yet start emitting light. However, ideally, the current level will be only just below the lasing-threshold. When the VCSEL 110 is to be turned on, the FET 440 may be turned on as described above so that the relatively high first drive current 136 may flow through the first drive current circuit and turn on the VCSEL 110. The additional FET 620 may then be turned off by the controller 430 by reducing the gate voltage at the additional FET 620, for example once the FET 440 is fully turned on. It will be appreciated that using the additional FET 620 in this way may speed up the time between the controller 430 starting to turn on the FET 440 and light being emitted from the VCSEL 110, since the VCSEL 110 will already be close to lasing at the time the FET 440 starts to switch on.

Figure 7:
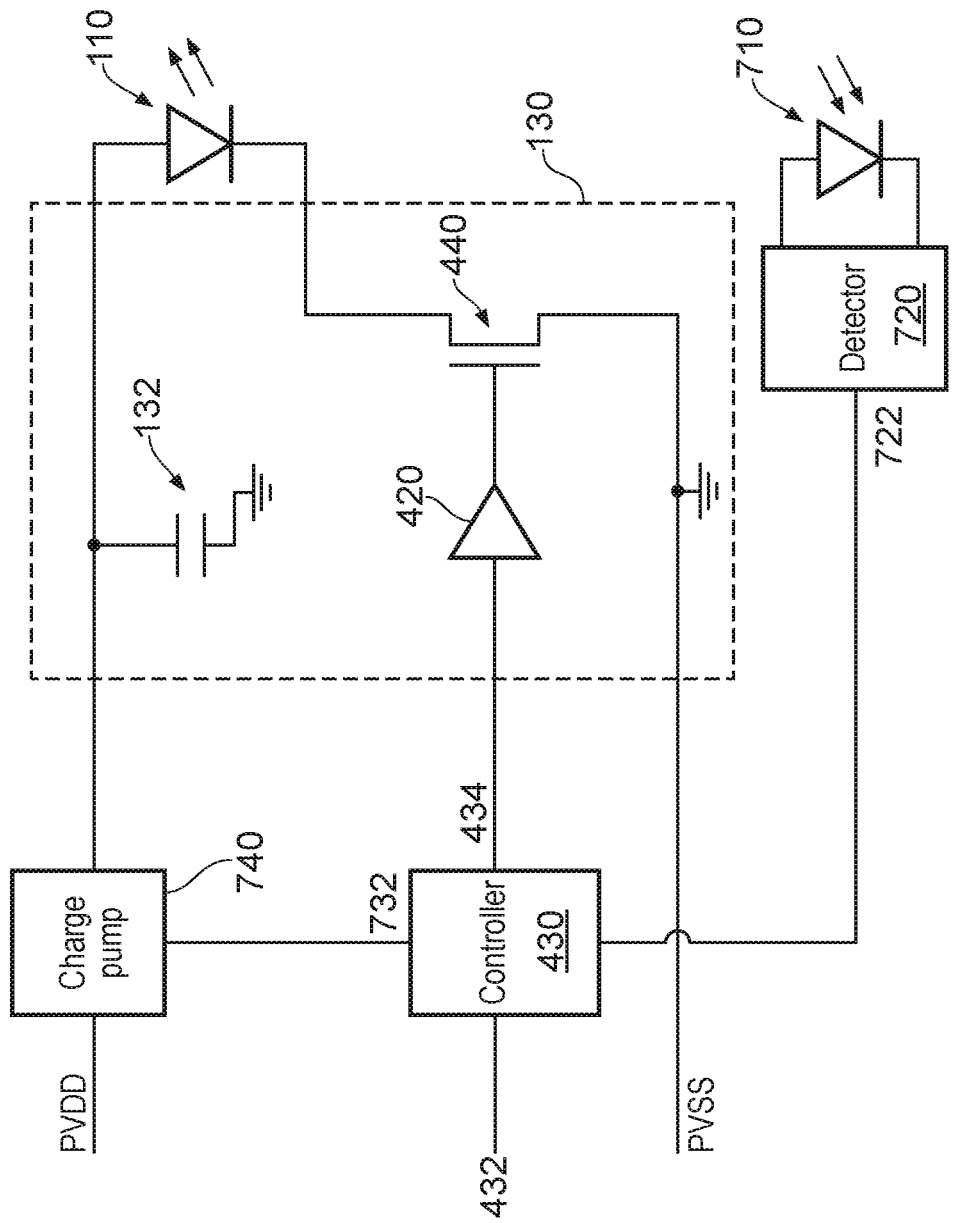
FIG. 7 shows a schematic representation of details of a further example implementation of the light source system of FIG. 1.

FIG. 7 shows an example of a further alternative implementation of aspects of the light source system 110. This implementation shows a simplified implementation of the first driver 130 that includes just the first capacitor 132, the turn-on pre-driver 420 and the FET 440. However, it will be appreciated that the first driver 130 may alternatively be implemented in the ways represented in FIG. 4, 5 or 6.

In this implementation, a photodetector 710 is configured to receive light emitted from the VCSEL 110. For example, the photodetector 710 may be the photodetector used for ToF imaging and may receive some stray light emitted from the VCSEL 110 and reflected directly back to the photodiode by device optics packaging, such that it detects light emitted from the VCSEL 110 (and not just light reflected from the object being imaged). Alternatively, it may be arranged in such a way as to directly receive light emitted from the VCSEL 110. The photodetector 710 is coupled to a detector 720, which is configured to output a signal 722 indicative of whether or not the photodetector 710 has received light output from the VCSEL 110. The controller 430 may then be configured to control the operation of a charge pump 740 based on the received signal 722. In particular, if the controller 430 transitions the first driver 130 to the emission state and subsequently receives a signal from the detector 720 indicating that the photodetector 710 received light output from the VCSEL 110, the controller 430 may then enable the charge pump 740 using control line 732. In this instance, the light source system can be assumed to be working correctly and the charge pump 740 will then be operable to charge the first capacitor 132 when the first driver 130 is next in the charging state. If, however, the detector 720 does not output a signal 722 indicative of the photodetector 710 having received light output from the VCSEL 110, the controller 430 may disable the charge pump 740 using control line 732. The charge pump 740 may then not charge the first capacitor 132 when the first driver 130 is next in the charging state, such that no further energy will be stored by the first capacitor 132 for use in trying to drive the VCSEL 110. In this instance, the photodetector 710 may not have received any light emitted from the VCSEL 110 because there may be some error or failure in the light source system that is preventing the VCSEL 110 from emitting light properly. Since the light source system may be used in safety critical ToF applications, or the fault may be of a type that would be electrically dangerous to the light source system and/or a nearby system and/or an operator, preventing further capacitor charging and attempted emissions from the VCSEL 110 may improve the overall safety of the light source system. Optionally, the controller 430 may be configured to output a failure warning to any other suitable systems/entities.

Whilst a charge-pump 740 is used in this particular example, any other suitable circuit/component may be used to control connection/disconnection of the first driver 130 to the power supply based on detection of light emitted from the VCSEL 110. For example, the charge pump 740 could be replaced with a switch (such as a transistor) controlled by the controller 430 to connect or disconnect the first driver 130 from the power supply PVDD. In a further alternative, rather than using a charge pump 740, the power supply could be a controllable power supply, such as a switch mode power supply, which may be controlled by the controller 430 to provide power, or not, to the first driver 130.

Whilst FIGS. 4 to 7, and the above explanations, relate only to the first driver 130, it will be appreciated that the second driver 140 may be implemented in exactly the same ways. The light source system 100 may have a single controller 430 that is configured to control the operation of the first driver 130 and the second driver 140 such that they each generate the first drive current 136 and the second drive current 146 at substantially the same time, or each of the first driver 130 and second driver 140 may have their own controller that operates as described above. Likewise, each of the first driver 130 and the second driver 140 may have a respective voltage regulator, or a single voltage regulator may be used to power the pre-drivers in both the first driver 130 and the second driver 140.

Whilst the arrangements represented in FIGS. 4 to 7 are effective at quickly turning the VCSEL 110 on and off in order to achieve a very short, high intensity current pulse, the inventors have identified some potential shortcomings with the switching control. In particular, it can be very difficult quickly to turn on the FET 440 and then quickly turn it off again only a very short period of time later. This is a result of the FET 440 being a relatively large FET 440 (which is required to handle the relatively large driver currents that will flow through it), which results in relatively large parasitics (in particular a large gate-drain parasitic) that make it difficult to drive the gate of the FET 440 with a short, well controlled gate signal. For example, an on-off pulse on control line 434 in the arrangement of FIG. 7 may have a less controlled, longer pulse of gate voltage on the FET 440 as a result of the parasitics. This in turn may result in a longer, less well controlled pulse of driver current through the VCSEL 110.

Controlling the on switching and off switching of FET 440 using two separate signals 434 and 436, as represented in FIGS. 4 to 6, may help to improve the situation and enable a faster, more controlled transition of the gate voltage of FET 440, and therefore the driver current flowing through the VCSEL 110. However, this arrangement may result in additional power consumption caused by the two signals competing with each other during the transition from the emission state to the charging state (i.e., when turning off the VCSEL 110 at the end of the light pulse).

Figure 8B:
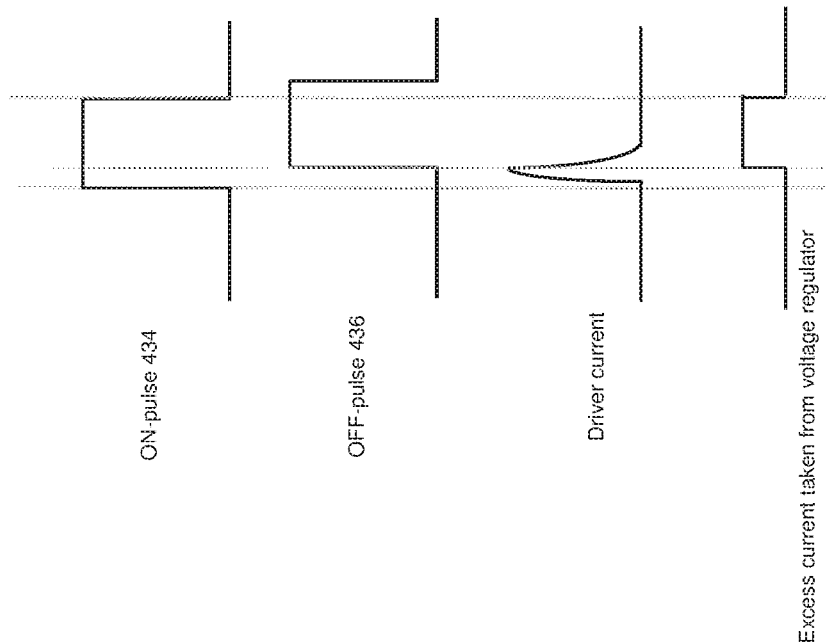
FIG. 8B shows an example representation of the control timing of the light source system of FIG. 8A.
Figure 8A:
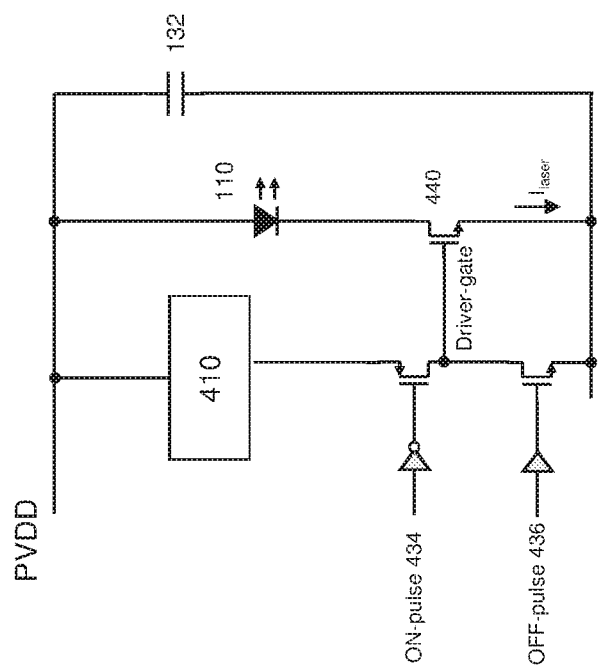
FIG. 8A shows a simplified representation of a further light source system in accordance with an aspect of the present disclosure.

FIGS. 8A and 8B shows some additional detail to help explain this. The circuit of FIG. 8A is based on that of FIG. 4, but includes an additional PMOS and an additional NMOS that may form part of the pre-drivers 420 and 422 for driving the gate of FET 440. The graphics of FIG. 8B show how the timing of the ON-pulse 434 and the OFF-pulse may result is a relatively fast switching of the FET 440 from off to on and back to off again, resulting in the relatively short and well controlled driver current $I_{laser}$. However, the represented PMOS and NMOS may both be on for a period of time during the turn-off process and therefore compete with each other. This can cause significant shoot through current from the regulator through both the PMOS and NMOS, resulting in significant additional power consumption. This is represented in FIG. 8B by "excess current taken from voltage regulator".

To address this issue, the inventors have developed a configuration of driver circuit that includes two primary transistors in the driver current circuit in order to control switching the VCSEL 110 on and off.

Figure 9:
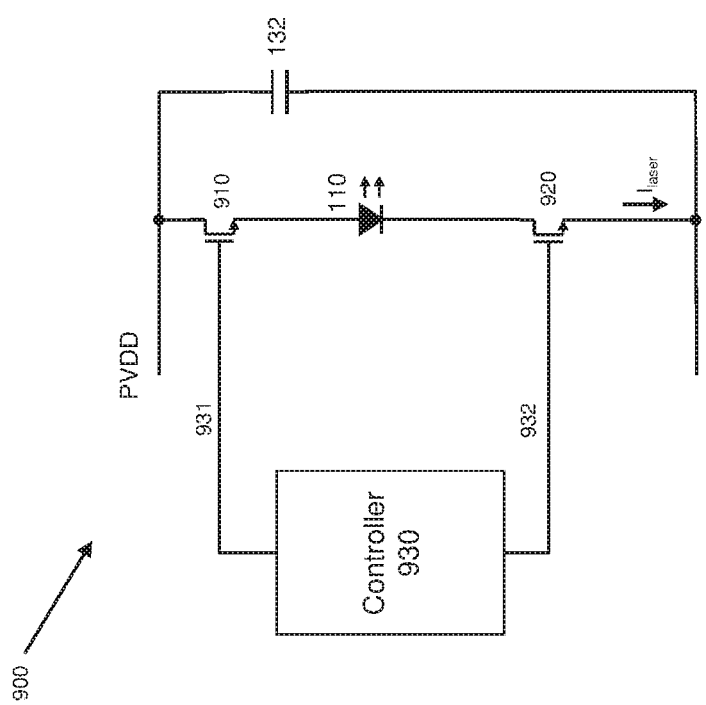
FIG. 9 shows an example representation of a further light source system in accordance with an aspect of the present disclosure.

FIG. 9 shows an example representation of a system 900 in accordance with this aspect of the disclosure. The system 900 comprises a first FET 910, a second FET 920 and a controller 930 configured to control the operation of the FETs. The controller 931 is configured to output a first control signal 931 for controlling the state of the first FET 910 and output a second control signal 932 for controlling the state of the second FET 920. The system 900 is suitable for coupling to the VCSEL 110 in such a way that when both FETs are in an on-state (conducting), the laser driver circuit is complete and the driver current $I_{laser}$ may flow through the VCSEL 110 to turn it on. If either FET is off, the laser driver circuit is broken and the driver current ceases to flow, causing the VCSEL 110 to turn off. In this example, the laser drive voltage is PVDD and the capacitor 132 supplies most of the driver current as explained below. However, the system 900 may be used with other power sources, for example the capacitor 132 may be omitted and the driver current supplied from some other external power source (such as the one supplying PVDD).

Figure 10:
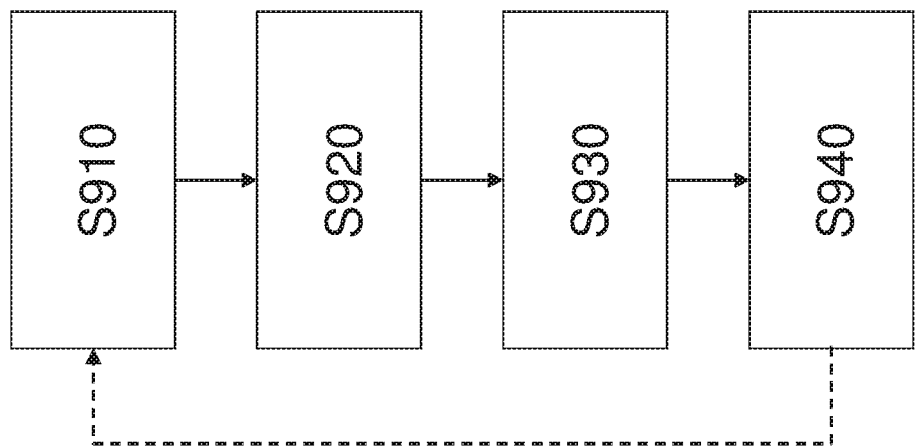
FIG. 10 shows example process steps for controlling a pulse emission of light from the light source system of FIG. 9.

FIG. 10 shows an example process of controlling a pulse emission of light from the VCSEL 110. In Step S910, the controller 930 uses the first control signal 931 to set the first FET 910 to a conducting state (i.e., an on-state) and uses the second control signal 932 to set the second FET 920 to a non-conducting state (i.e., an off-state). In this example, the first FET 910 is an NMOS, so the first FET 910 may be turned on by transitioning the voltage of signal 931 from a low signal to a high signal (i.e., increasing the signal voltage from below the threshold turn-on voltage of the first FET 910 to above the threshold turn-on voltage). The second FET 920 may be held in a non-conducting state by simply holding the signal 932 below the threshold turn-on voltage of the second FET 920.

In Step S920, the VCSEL 110 is turned on by the controller 930 using the second control signal 932. In this example, because the second FET 920 is an NMOS, the controller 930 may do this by increasing the voltage of signal 932 to be above the turn-on threshold of the second FET 920. Both FETs are now conducting such that the laser drive circuit is complete and laser drive current starts to flow through the VCSEL 110, initiating the laser light pulse.

In Step S930, the VCSEL 110 is turned off by the controller 930 using the first control signal 931 to set the first FET 910 to the non-conducting state. In this example, the controller 930 may do this by reducing the voltage of signal 931 to be below the turn-on threshold of the first FET 910. This will break the laser drive circuit such that laser drive current ceases to flow through the VCSEL 110 and the laser light pulse ends.

In Step S940, the controller 930 may reset the system 900 by using the second control signal 932 to set the second FET 920 to the non-conducting state. In this example, the controller 930 may do this by reducing the voltage of signal 932 to be below the turn-on threshold of the second FET 920. The process may then return to step S910 when a further light pulse is desired.

In this process, the VCSEL 110 is turned on by changing the state of the second FET 920 (from off to on) and is subsequently turned off by changing the state of the first FET 910 (from on to off). As a result, there is no need to change very quickly the state of a single transistor from off to on and then back off again in order to achieve a relatively short light pulse from the VCSEL 110. The time period between turning on the first FET 910 in Step S910 and turning on the second FET 920 in Step S920 may be relatively long to allow for the first transistor 910 to turn on full before the VCSEL 110 is turned on. As a result, soon after turning on the second FET 920 in Step S920, the first FET 910 may be straightforwardly turned off in Step S930. Consequently, the time before between turning on the second FET 920 and turning off the first FET 910 may be relatively short (for example, in the order of 100s of picoseconds or less, such as less than 1 nanosecond, or less than 800 picoseconds, or less than 500 picoseconds, or less than 200 picoseconds, or less than 100 picoseconds), without suffering from the high power consumption associated with trying quickly to switch a single FET 440.

FIG. 11 shows an example representation of the timing of the first signal 931 and the second signal 932. The time period between step S920 and S930 may be set by the controller 930 based on a target light pulse emission duration as the time difference between the transition at Step S920 and the transition at Step S930 affects the time for which the driver current flows through the VCSEL 110, and therefore the time for which the VCSEL 110 is on and emitting light.

The representation of FIG. 9 assumes that the controller 930 can set and control sufficiently large and strong signals to change the state of the FETs quickly, particularly quick and controlled switching on of the second FET 920 and quick and controlled switching off of the first FET 910. However, this assumption may not always be reasonable, particularly where the FETs are relatively strong/large in order to handle relatively large drive currents (for example, >1 A, or >3 A, or >5 A, or >8 A, or >10 A). Various further detailed configurations designed to achieve this control of the FETs shall now be described.

Figures 12A, 12B:
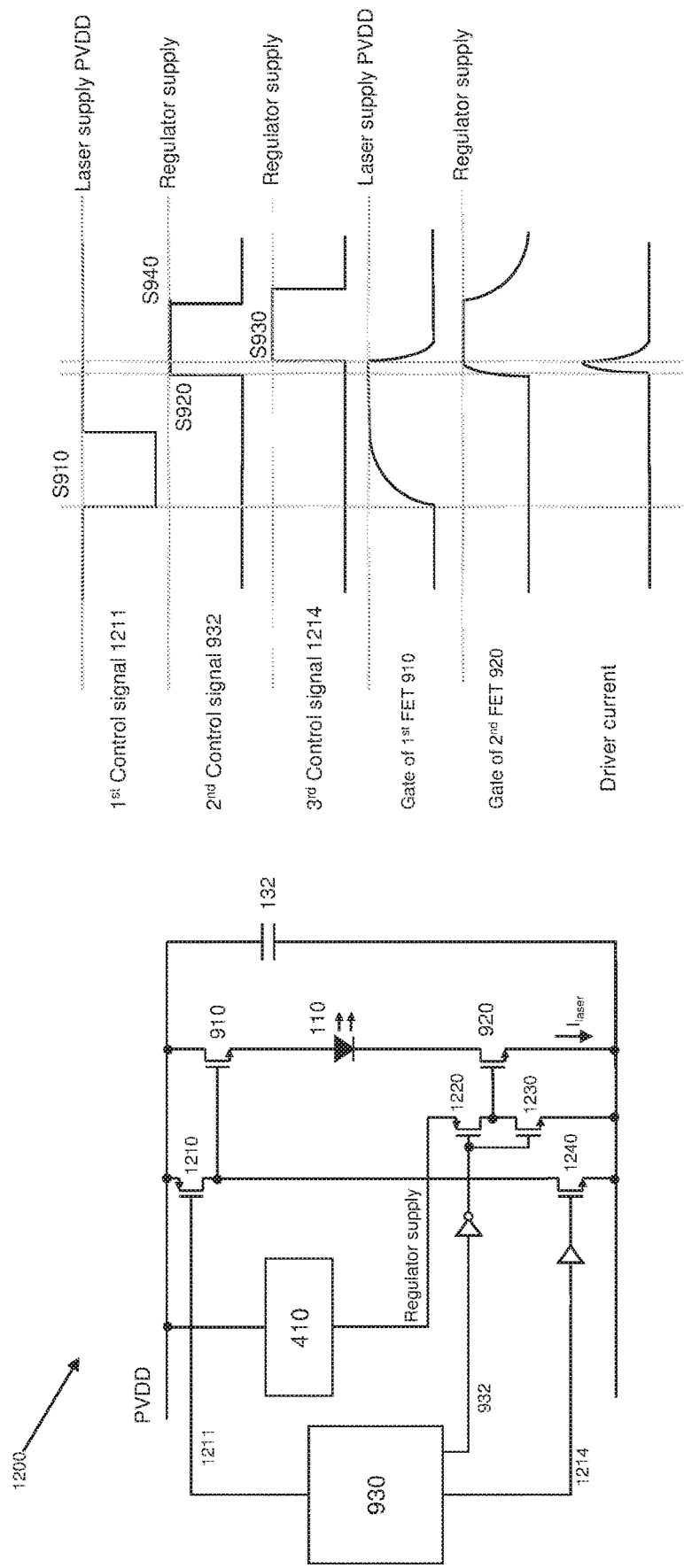
FIGS. 12A and 12B shows a representation and control timing of an example implementation of the system of FIG. 9.

FIG. 12a shows an example laser light source system 1200 in accordance with a further aspect of the present disclosure. FIG. 12b shows an example representation of the timing of the control signals output by the controller 930 in order to execute the process described with reference to FIG. 10.

System 1200 is similar to the system 900 described earlier, but includes some additional components for controlling the operation of the primary FETs 910 and 920. The controller 930 outputs a first control signal 1211 for controlling the state of a pre-charge transistor 1210. The first control signal 1211 may be used to switch on the first FET 910 by turning on the pre-charge transistor 1210 in Step S910. In this example the pre-charge transistor 1210 is a PMOS, so the controller 930 turns the transistor 1210 on by reducing the voltage of the first control signal 1211 to be below the turn-on threshold of transistor 1210. Turning on the transistor 1210 will result in a turn-on voltage being applied to the gate of the first FET 910, in this case the laser drive voltage PVDD being applied to the gate of the first FET 910. This will pre-charge the first FET 910 by charging capacitance associated with the control terminal (the gate) of the FET 910 (for example, the parasitic gate-source capacitance of the FET 910, although it may alternatively be a capacitor coupled between the control terminal and a channel terminal, such as between the gate and source terminals of the FET 910). After a period of time, the controller 930 may turn off the pre-charge transistor 1210 using the first control signal 1211 (for example, increasing the voltage to about PVDD) and the first FET 910 will be held in the on-state by the charged capacitance associated with the control terminal of the first FET 910. This can be seen in the control signals timing diagram for the 1$^{st}$ control signal 1211 and the gate of the first FET 910 in FIG. 12b. By turning on the first FET 910 by pre-charging the first FET 910 in this way, the controller 930 does not need to output any particularly large or strong signals in order to control the operation of the relatively large/strong first FET 910. Furthermore, by turning off the pre-charge transistor 1210 once pre-charging is complete and then subsequently turning on transistor 1240 at step S930 (explained later), there is no moment in time at which both the pre-charge transistor 1210 and transistor 1240 are turned on. As a result, there should be no shoot-through current through transistors 1210 and 1240, which may significantly reduce power consumption associated with the rapid switching of the VCSEL 110.

Furthermore, the gate voltage of the first FET 910 may be increased to the laser supply voltage with a relatively weak transistor 1210. It may take a relatively long period of time to pre-charge the gate of FET 910 in order to turn it on (as can be seen in FIG. 12b), but this is acceptable because owing to the arrangement of the laser drive circuit, the speed of switch on for the first FET 910 is not important. Optionally, the first control signal 1211 may pass through a pre-driver, similar to the pre-divers 420 or 422 described earlier, powered by the laser drive voltage PVDD.

Throughout this description, relatively "weak"/"small" and "strong"/"large" transistors shall be referred to. The relative terms "weak" and "strong" refer to relative drive strengths of transistors (i.e., how much current the transistor can deliver for a given gate drive voltage). A "weak" transistor delivers a relatively low channel current for a given gate drive voltage compared with a "strong" transistor. The relative strength of a transistor can be controlled by virtue of the design of the transistor, for example by its W/L ratio, which influences the drain-source current equation (which approximates in saturation to $I_{ds}=W/L*G_m*(V_{gs}-V_t)^2$). In order rapidly to turn on or turn off the relatively strong/large FETs 910 and 920, the gate of the FETs 910 and 920 may need to be driven by a relatively large gate current, which might typically require a relatively strong driving transistor(s). However, the inventors have realised it is preferable where possible to design the driving circuit to use relatively weak transistors to control the switching of the FETs 910 and 920, and try to minimise the number of relatively strong transistors used for switching the FETs 910 and 920. According to the present disclosure, to drive a relatively strong transistor, a gate signal with a current of at least 0.5 A, for example 1A or 2 A, may be required. The channel current may be in the range of 1 A to 100A. According to the present disclosure, to drive a relatively weak transistor, a gate current of less than 100 mA, for example 50 mA, or 25 mA, may be required. The channel current of a relatively weak transistor may be up to about 300 mA, such as 100 mA, or 200 mA. Therefore, it can be seen that controlling the switching of the first and second FETs 910 and 920 using weak transistors wherever possible may be desirable, in order to minimise current requirements and potentially enable direct gate control by the control signals (if the controller 930 can output signals with sufficient current to drive a weak transistor).

After turning on the first FET 910, in Step S920 the controller 930 turns on the second FET 920 using the second control signal 932, thereby turning on the VCSEL 110. This is much the same as described earlier with reference to FIG. 9, but some further switching circuitry is used in the arrangement of FIG. 12a in order quickly to turn on the relatively large/strong second FET 920. In particular, push/pull transistors 1220 and 1230 are configured such that when the second FET 920 is to be switched on, PMOS 1220 is turned on by the second signal 932 and NMOS 1230 is turned off by the second signal. Turning on the PMOS 1220 and turning off the NMOS 1230 results in the regulated supply voltage output from the voltage regulator 410 (described earlier) being applied to the gate of the second FET 920 in order quickly to turn on the second FET 920. The PMOS 1220 may be relatively large/strong in order to control a sufficiently large and strong signal on the gate of the second FET 920. To help control a relatively large/strong FET, the second control signal 932 may pass through a pre-driver (which may be powered by the regulated supply voltage output from the regulator 410, although that is not represented in FIG. 12a for the sake of simplicity). In FIG. 12a, the pre-driver is represented as an inventing type, but it may be non-inverting if the nature of signal level transitions of the second control signal 932 are suitable. Furthermore, the use of a pre-driver is optional, depending on the nature of transistor 1220 and the nature of the control signal output from controller 930.

It will be appreciated that the push/pull transistors 1220 and 1230 in this arrangement, and in all arrangements described below, are optional. For example, the second control signal 932 (or the output of the driver through which the second control signal 932 passes) may be strong enough to drive the second FET 920.

In Step S930, the controller 930 turns off the first FET 910 using a third control signal 1214. The third control signal controls a turn-off transistor 1240. The controller 930 sets the third control signal to turn on transistor 1240, which causes the capacitance associated with the control terminal of the first transistor 910 to be discharged, thereby turning off the first FET 910. In order to achieve a relatively fast switch off of the first FET 910, the turn-off transistor 1240 may be relatively large/strong so that it can change state quickly and discharge the capacitance of the first FET 910 quickly. Therefore, the third control signal 1214 may optionally pass through a pre-driver (which may be inverting or non-inverting, depending on the nature of the third-control signal transitions). Where a pre-driver is used, it may be powered in any appropriate way, for example from the regulated supply voltage output from the voltage regulator 410.

In Step S940, the controller 930 turns off the second FET 920 using the second control signal 932 by turning off transistor 1220 and turning on transistor 1230. This lowers the gate voltage of the second FET 920 to be below its turn-on threshold voltage, thereby turning off the second FET 920. The transistor 1230 may be a relatively small/weak transistor as fast turn-off of the second FET 920 is not important, so a slow turn-off of FET 920 is acceptable (as can be seen in the timing of control signals of FIG. 12*b*).

FIG. 13*a* shows an example laser light source system 1300 in accordance with a further aspect of the present disclosure. FIG. 13*b* shows an example representation of the timing of the control signals output by the controller 930 in order to execute the process described with reference to FIG. 10.

In this arrangement, the first FET 910 is a PMOS. The system 1300 further includes a pre-charge voltage regulator 1310 arranged to set the pre-charge voltage to be applied to the gate of the first FET 910 in order to turn it on during Step S910. The pre-charge supply voltage output by the regulator 1310 is below the laser supply voltage PVDD by an amount that exceeds the turn-on threshold voltage of the first FET 910. To pre-charge the first FET 910, the controller 930 increases the voltage level of the signal 1211 to turn on the transistor 1310 and keeps the third control signal 1214 at a level that maintains the transistor 1340 as being off. When transistor 1310 is turned on, the voltage at the gate of the first FET 910 reduces as shown in FIG. 13*b* as the capacitance associated with the first FET 910 is charged. Once the first FET 910 is pre-charged, the controller 930 may then change the first control signal 1211 again so that transistor 1310 turns off and the first FET 910 remains on. In this arrangement, the transistor 1310 may be relatively small/weak, since turn on speed of the first FET 910 is not important.

Steps S920 and S940 may be performed as explained earlier. Step S930 may be performed by the controller 930 by setting the third control signal 1214 such that transistor 1340 turns on, which turns off the first FET 910. The transistor 1340 may be relatively large/strong in order to achieve a fast turn off of the first FET 910. The gate of transistor 1340 may optionally be driven by an inverting or non-inverting driver, depending on the transitions of the third control signal 1214 and depending on the signal driving requirements of the gate of the transistor 1340.

Figures 14A, 14B:
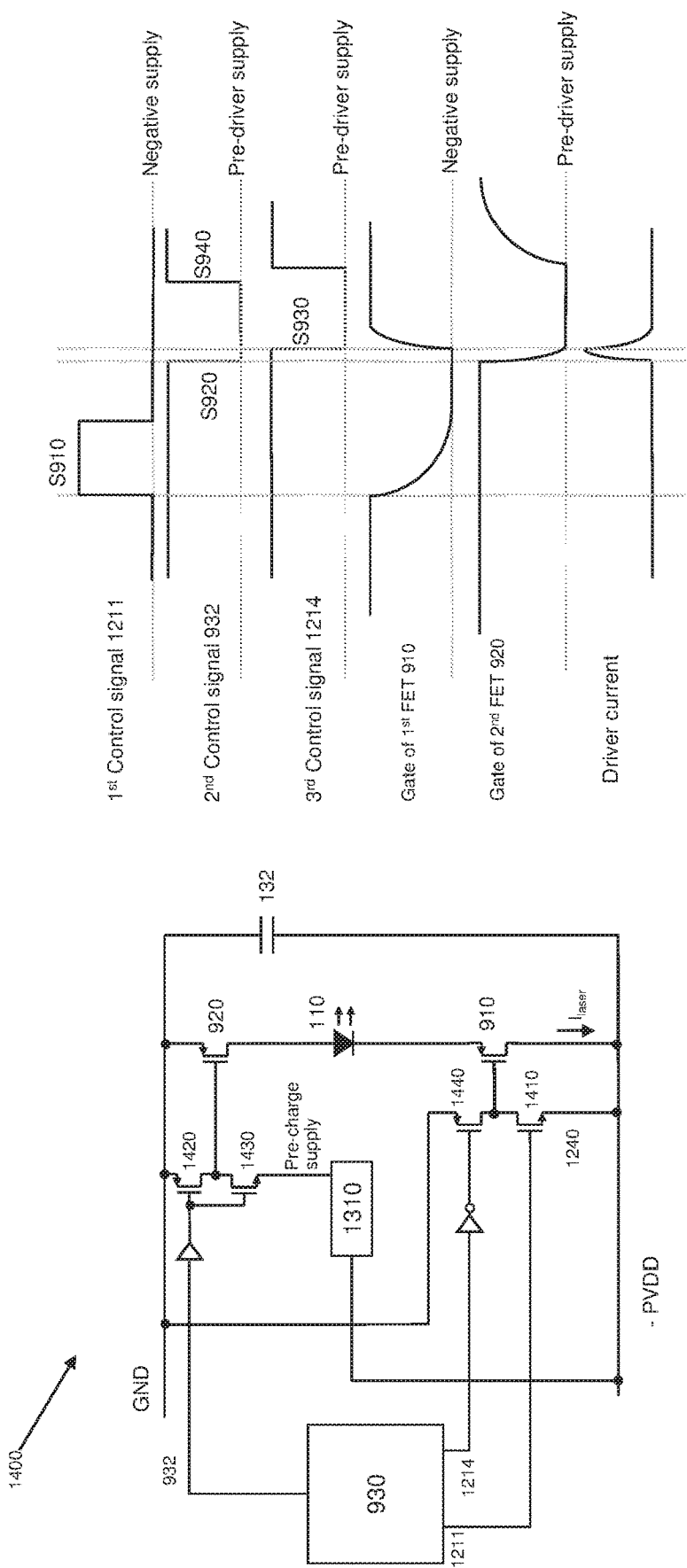
FIGS. 14A and 14B shows a representation and control timing of a further example implementation of the system of FIG. 9.

FIG. 14*a* shows an example laser light source system 1400 in accordance with a further aspect of the present disclosure. FIG. 14*b* shows an example representation of the timing of the control signals output by the controller 930 in order to execute the process described with reference to FIG. 10.

In this arrangement, both the first and second FETs 910 and 920 are PMOS FETs. The supply voltage –PVDD is a negative supply voltage. In Step S910, the controller 930 pre-charges the first FET 910 in order to turn it on by turning on pre-charge transistor 1410 using the first control signal 1211. Once the capacitance associated with the first transistor 910 is charged, the first control signal 1211 may turn off the pre-charge transistor 1410 and the first FET 910 will remain on. The pre-charge transistor 1410 may be relatively small/weak, since switch on speed of the first FET 910 is not important.

In Step S920, the controller 930 may switch on the second FET 920 by controlling the second control signal 932 to turn off transistor 1240 and turn on transistor 1430, thereby lowering the gate voltage of the second FET 920 and turning it on. The transistor 1430 may be relatively large/strong in order apply a relatively strong gate voltage signal to the second FET 920, thereby turning the second FET 920 on quickly.

In Step S930, the controller may switch off the first FET 910 by controlling the third control signal 1214 to turn on transistor 1440, such that the pre-charged capacitance associated with the gate of the first FET 910 discharges and the gate voltage of the first FET 910 increases in order to turn off the first FET 910. The transistor 1440 may be relatively large/strong in order to control a strong gate voltage at the first FET 910, thereby turning it off quickly.

Finally, in Step S940, the controller 930 may switch off the second FET 920 by controlling the second control signal 932 to turn on transistor 1420 and turn off transistor 1430, such that gate voltage of the second FET 920 increases in order to turn off the second FET 920. The transistor 1420 may be relatively small/weak, since turn off speed of the second FET 920 is not important.

Figures 15A, 15B:
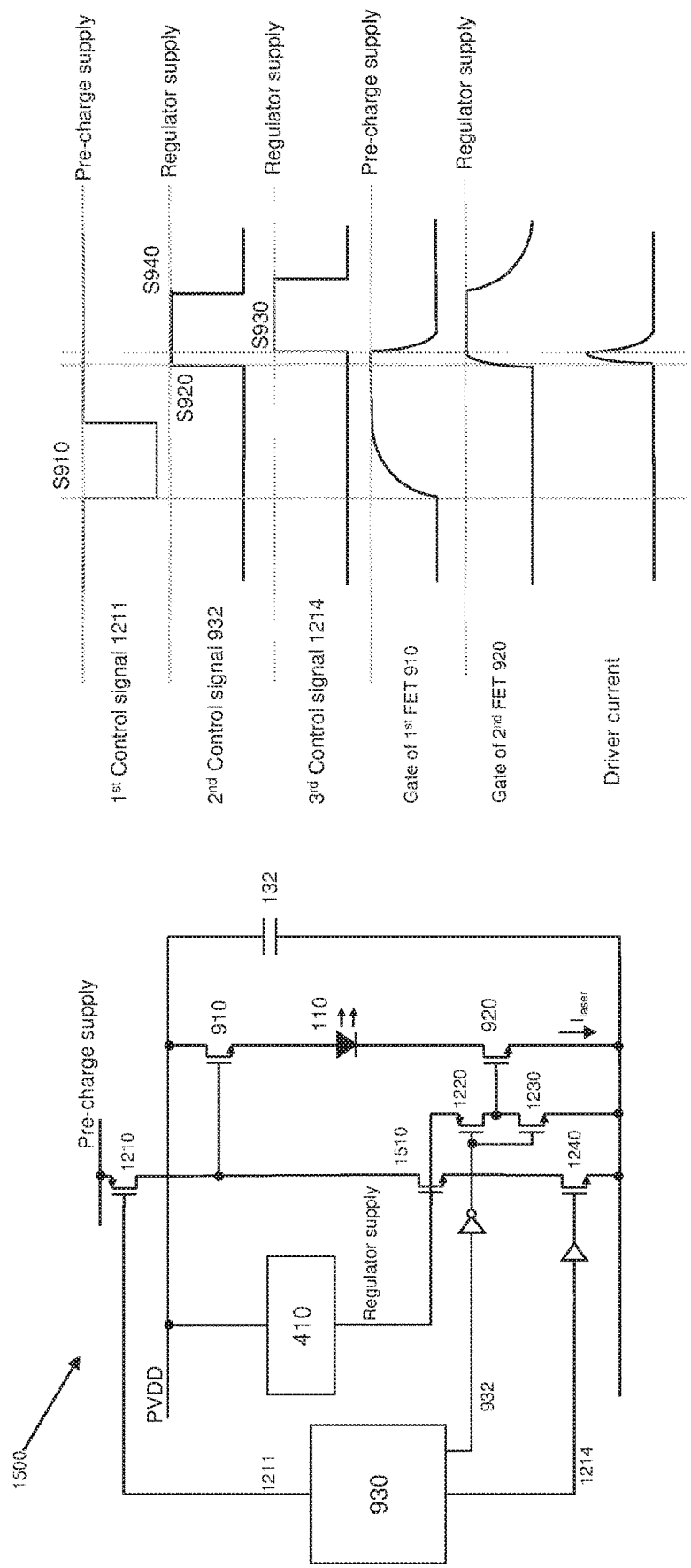
FIGS. 15A and 15B shows a representation and control timing of a further example implementation of the system of FIG. 9.

FIG. 15*a* shows an example laser light source system 1500 in accordance with a further aspect of the present disclosure. FIG. 15*b* shows an example representation of the timing of the control signals output by the controller 930 in order to execute the process described with reference to FIG. 10.

The system 1500 is very similar to system 1200 described with reference to FIGS. 12*a* and 12*b*, but the pre-charge transistor 1210 is not coupled to the laser voltage supply PVDD and is instead coupled to a separate pre-charge supply. The pre-charge supply may be larger in magnitude than the laser voltage supply, which may help to turn on the first FET 910 more strongly. In more detail, in the earlier described system 1200 the gate of the first FET 910 may be pulled up to approximately PVDD when the pre-charge transistor 1210 is turned on, and the gate-source voltage of the first FET 910 will be approximately at the threshold voltage of the first FET 910. The anode of the VCSEL 110 is coupled to the source of the first FET 910 and so will be at approximately PVDD minus the threshold voltage of the first FET 910. However, in the system 1500, the gate voltage of the first FET 910 is taken to approximately the pre-charge supply when the pre-charge transistor 1210 is turned on. If the magnitude of the pre-charge supply is greater than PVDD by an amount approximately equal to or greater than the turn on threshold of the first FET 910, when the first FET 910 is turned on its source voltage may be approximately PVDD (in practice it may be slightly lower than PVDD owing to the channel resistance of the first FET 910), which is higher than achieved in the system 1200. Furthermore, by increasing the gate-source voltage of the first FET 910 further beyond its threshold voltage, the channel resistance of the first FET 910 may be further lowered. The pre-charge supply may come from any suitable source of voltage supply.

A further difference is the inclusion of a cascode transistor 1510 in the first FET 910 turn-off, discharge path. Including one or more cascode transistors 1510 in the discharge path of the first FET 910 may enable the stored charge on the gate of the first FET 910 to discharge more easily at Step S930, which may enable the transistor 1240 controlling the discharge to be a relatively faster and smaller low voltage transistor. The cascade transistor 1510 is an optional feature in the system 1500 and may optionally be included in the first FET 910 discharge path of any of the system described with reference to FIGS. 12-14 and 16 and 17.

Figure 16B:
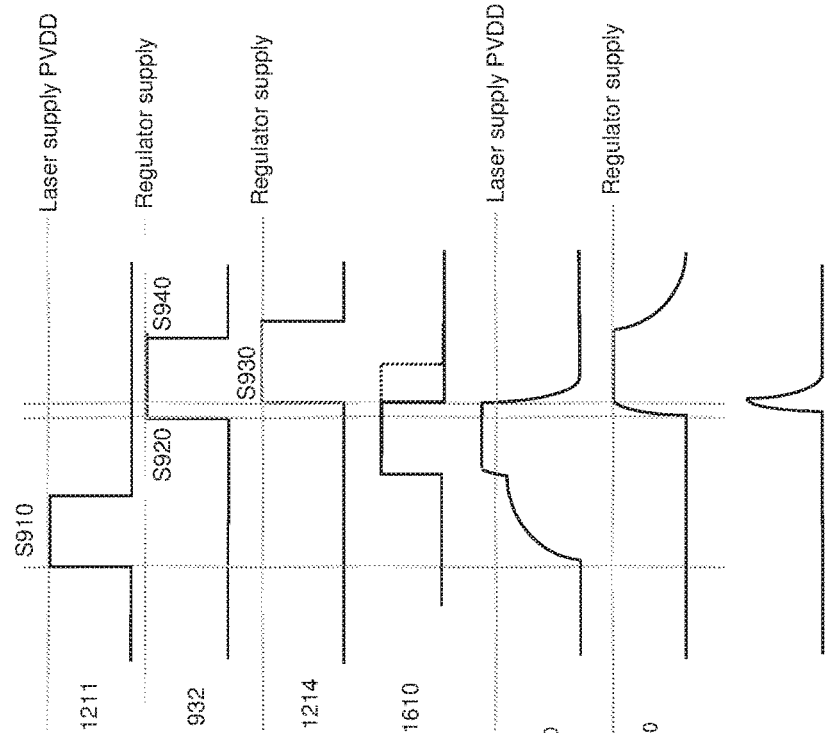
FIGS. 16A and 16B shows a representation and control timing of a further example implementation of the system of FIG. 9.
Figure 16A:
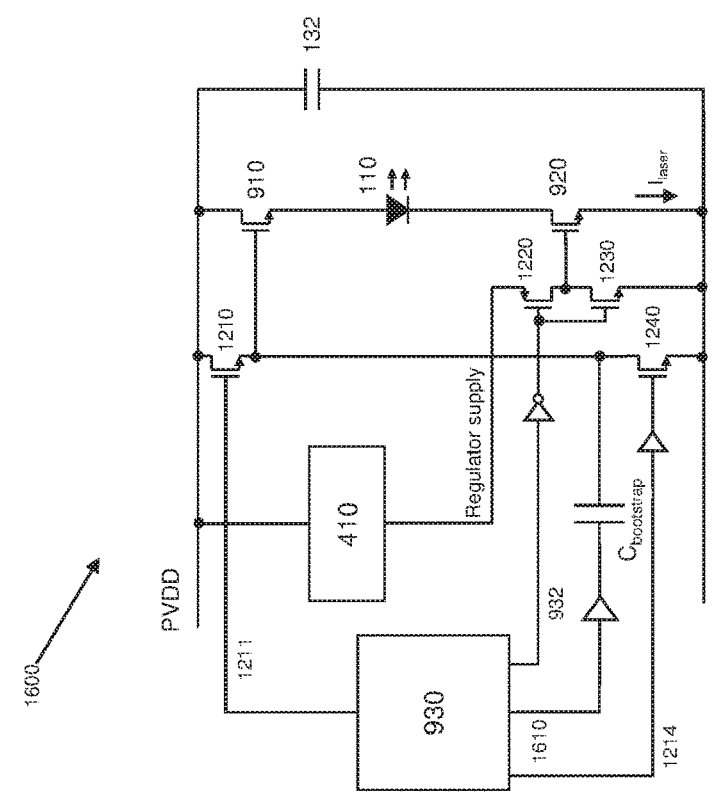

FIG. 16a shows an example laser light source system 1600 in accordance with a further aspect of the present disclosure. FIG. 16b shows an example representation of the timing of the control signals output by the controller 930 in order to execute the process described with reference to FIG. 10.

The system 1600 is very similar to system 1200 described with reference to FIGS. 12a and 12b, but the controller 930 is configured to output a fourth control signal 1610. The fourth control signal 1610 is configured to apply a voltage to a first plate of a bootstrap capacitor, wherein the second plate of the bootstrap capacitor is coupled to the control terminal of the first transistor 910. Applying this voltage increases the gate voltage of the first FET 910, such that it may be raised above the laser voltage supply. The controller 930 may be configured to apply the voltage using the fourth control signal 1610 at any time after the first FET 910 is switched on in Step S910 and before the second FET 920 is switch on in Step S920. The voltage may be removed at the same time as turning off the first FET 910 in Step S930, or at any suitable time after that (meaning that the transition of the third control signal 1214 and the fourth control signal 1610 do not have to be aligned). In this way, the gate voltage of the first FET 910 may be taken above the laser voltage source without requiring a separate power supply. If the controller 930 is powered, for example, by the regulator supply output by the voltage regulator 410, then the voltage applied to the bootstrap capacitor may be the regulator supply. The bootstrap arrangement of system 1600 may optionally be included in any of the systems described with reference to FIGS. 12-15 and 17.

Figures 17A, 17B:
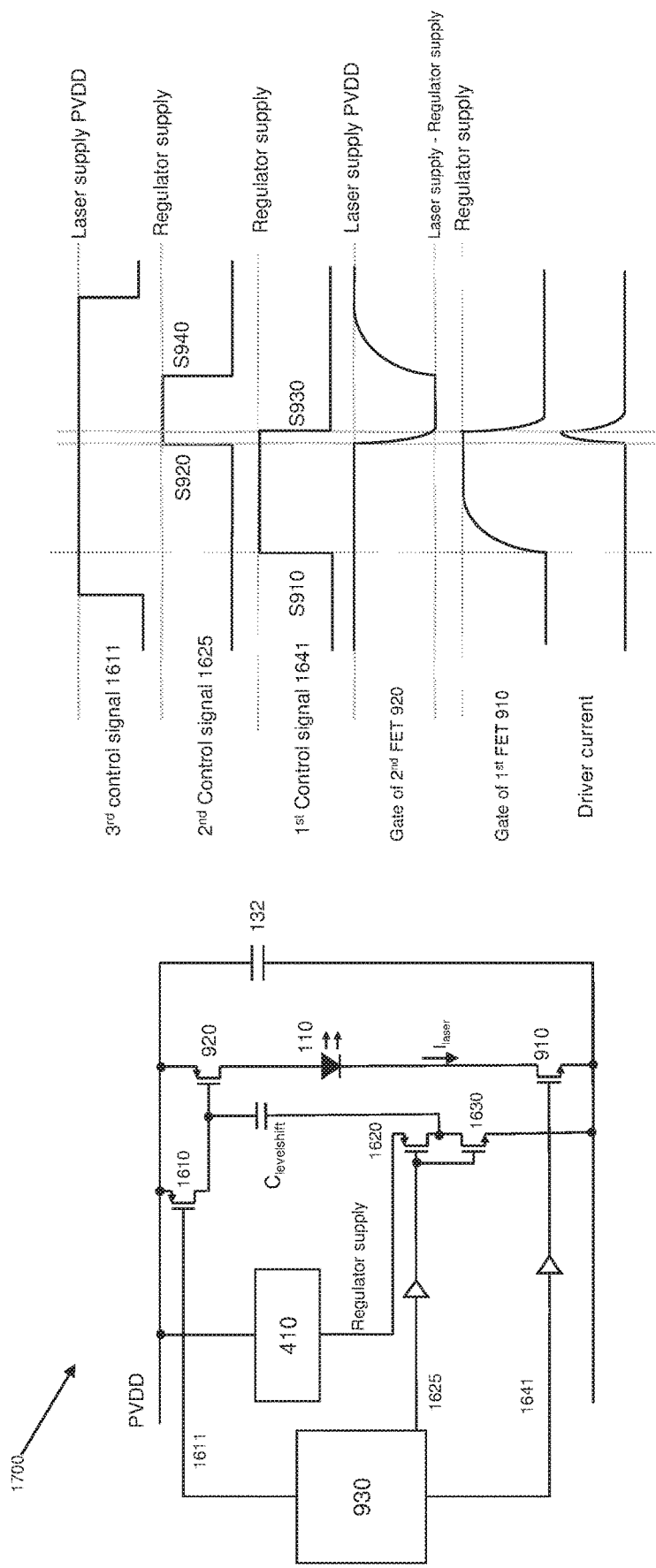
FIGS. 17A and 17B shows a representation and control timing of a further example implementation of the system of FIG. 9.

FIG. 17a shows an example laser light source system 1700 in accordance with a further aspect of the present disclosure. FIG. 17b shows an example representation of the timing of the control signals output by the controller 930 in order to execute the process described with reference to FIG. 10.

The controller 930 may directly control (optionally via a pre-driver) the state of the first FET 910 using the first control signal 1641. Therefore, Steps S910 and S930 may be achieved by suitable transitions of the first control signal 1641 to set the gate voltage of the first FET above or below the turn-on threshold of the first FET 910 as necessary, as shown in FIG. 17b. It is assumed in 17b that the first control signal 1641 drives the gate voltage via a driver, which is powered by the regulator supply.

For Step S920, the controller 930 may use the second control signal 1625 to turn off transistor 1620 and turn on transistor 1630. The level shift capacitor $C_{levelshift}$ may thereby reduce the gate voltage of the second FET 920 to be below PVDD by an amount exceeding the turn on threshold of the second FET 920, thereby turning on the second FET 920. The transistor 1630 may be a relatively strong transistor, in order to control a strong signal at the gate of the second FET 920, thereby turning it on quickly. The transistor 1620 may be relatively weak, since it is not required to control a strong signal when switching.

For Step S940, the controller 930 may transition the second control signal 1625 back, such that transistor 1620 is turned on and transistor 1630 is turned off. This will result in the gate voltage of the second FET 920 being pulled back to high by the level shift capacitor, such that the gate voltage of the second FET 920 is raised back to towards PVDD and the second FET 920 turns off. The transistor 1620 may be relatively weak, since it is not important that the second FET 920 turns off quickly in Step S940.

Finally, the controller 930 may optionally output a third control signal 1611 to the gate of transistor 1610. At some time prior to the switching of Step S920, the controller 930 may set the level of signal 1611 to high (for example, at or close to PVDD), which turns off transistor 1610 and allows the gate of the second FET 920 to float and be controlled using the second control signal 1625 (as described above). Sometime after Step S940, the controller 930 may set the level of signal 1611 low (i.e., below the turn-on voltage of transistor 1610), which turns transistor 1610 on and holds the gate of the second FET 920 high. This may help to prevent the gate voltage of the second FET 920 from drifting between light pulses (for example, by virtue of leakage or parasitic coupling), which could result in switching difficulties in Steps S920 and S940. However, in an alternative, transistor 1610 and the third control signal 1611 may be omitted and the gate of the second transistor 920 be merely coupled to the level shift capacitor. When the transistor 1610 is used, it may be relatively weak since the timing of transitions in the third control signal 1611 relative to transitions in the second control signal 1625 can be set such that fast switching of transistor 1610 is not required.

Figure 18:
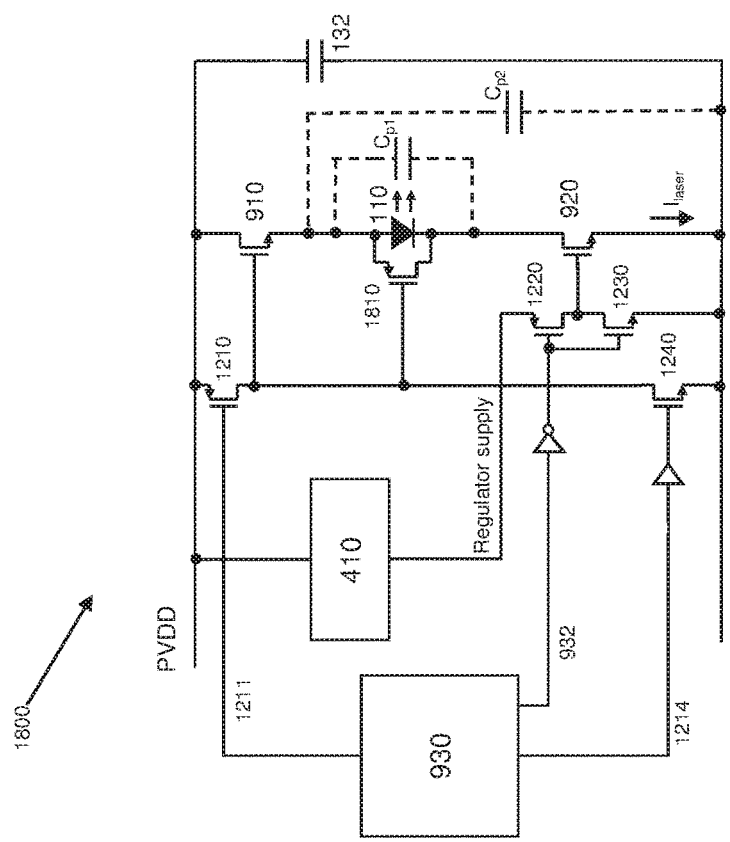
FIG. 18 shows a representation of a further example implementation of the system of FIG. 9.

FIG. 18 shows an example laser light source system 1800 in accordance with a further aspect of the present disclosure. The system 1800 of FIG. 18 is very similar system 1200 described earlier, but includes an additional discharge transistor 1810 coupled in parallel across the VCSEL 110 and arranged to be turned on and create a discharge path at the time of turning off the first FET 910 (Step S930), so as to discharge parasitic charge associated with the laser light source. The VCSEL may have one or both of parasitic capacitances $C_{p1}$ and/or $C_{p2}$, which may result in residual energy slowing down the turning off of the VCSEL 110. The arrangement of the discharge transistor 1810 may help to discharge the parasitic charge associated with the VCSEL 110, thereby even further increasing the speed of VCSEL 110 switch off. The discharge transistor 1810 may be used in combination with any of the configurations described above with reference to FIGS. 9 to 17.

Figure 19:
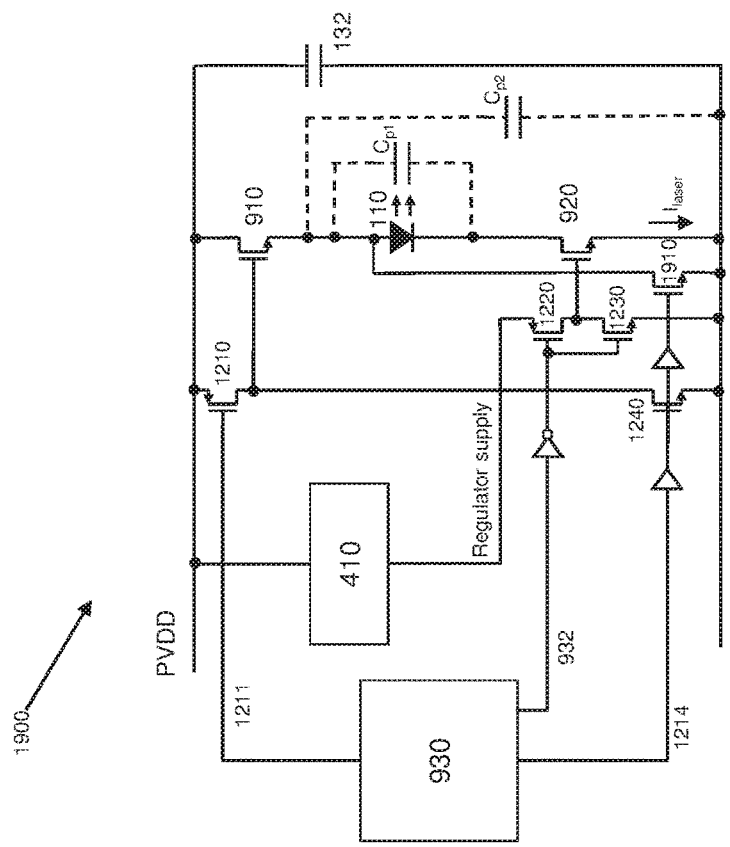
FIG. 19 shows a representation of a further example implementation of the system of FIG. 9.

FIG. 19 shows an example laser light source system 1900 in accordance with a further aspect of the present disclosure. The system 1900 of FIG. 19 is very similar system 1200 described earlier, but includes an additional discharge transistor 1910 coupled to the VCSEL 110 to help discharge parasitic charge associated with the VCSEL 110. The discharge transistor 1910 is arranged to turn on and create a discharge path approximately at the time of turning off the first FET 910. This may help to even further increase the speed of VCSEL 110 switch off. The arrangement represented in FIG. 19 includes an optional additional driver coupled to the gate of the transistor 1910, which has been included to add a delay to the driving of the transistor 1910 so as to reduce the chances of shoot through current flowing through the first FET 910 and the discharge transistor 1910. Hence, the transistor may be arranged to turn on at approximately the same time as the VCSEL 110 switch off (for example, at the same time as, or at a time shortly after, turn off of the first FET 910). Whilst the discharge transistor 1910 is represented as being coupled to the cathode of the VCSEL 110, it may alternatively be coupled to the anode.

It will be appreciated from all of FIGS. 9 to 17b that controller 930 may control the state of the first and second FETs 910 and 920 in various different ways using various different circuits in order to carry out the process of FIG. 10. Each of the first and second FETs 910 and 920 may be n-type or p-type and either may be coupled to the anode or cathode of the VCSEL 110. Furthermore, whilst in each of the systems described above one of the FETs 910 and 920 is coupled to the anode of the VCSEL 110 and the other to the cathode of the VCSEL 110, in an alternative the first and second FETs 910 and 920 may be coupled to each other in series, with both FETs on the cathode side or the anode side of the VCSEL 110.

Typically, the second FET 920 may set the current flowing through the VCSEL 110, since the first FET 910 will usually be sufficiently on at the start of Step S920 not to affect the laser drive current. Therefore, as a further benefit of the arrangements of FIGS. 9 to 17b, the size of the laser drive current may be controlled/set by virtue of the transistor that is chosen for the second FET 920 and the way in which its gate voltage is controlled in order to switch it on (for example, how quickly the gate voltage is able to switch the second FET 920 on).

The skilled person will readily appreciate that various alterations or modifications may be made to the above described aspects of the disclosure without departing from the scope of the disclosure.

For example, whilst the above example first driver 130 includes one or more pre-drivers 420, 422, etc, in an alternative, the pre-drivers may be omitted entirely and the FET 440 (and optionally also additional FET 620) may be driven directly by the controller 430. In this alternative, the voltage regulator 410 may be omitted entirely. Furthermore, even when the first driver 130 includes one or more pre-drivers, whilst it may be beneficial to power the pre-drivers using the voltage regulator 410, at least one of the one or more pre-drivers may alternatively be powered in any other suitable way and the voltage regulator omitted from the first driver 130.

Whilst in the above examples, FETs are used (for example, FET 440 and additional FET 620), any other suitable type of controllable switch may alternatively be used, for example any other type of transistor, such as BJTs, etc. Therefore, whenever the gate of a FET is referred to, this should be understood to be the control terminal or gate/base of a transistor.

Furthermore, whenever the source of a FET is referred to, this should be understood to be a channel terminal or source/emitter of a transistor, and whenever the drain of the FET is referred to, this should be understood to be a channel terminal or drain/collector of a transistor.

In some aspects of the above disclosure, two drivers (the first driver 130 and the second driver 140) are described. Using two drivers may be particularly beneficial for the VCSEL 110 design represented in FIGS. 1, 2A and 2B, where there are two anode terminals on the surface of the VCSEL 110, so that the two drivers may be arranged symmetrically within the die 120. However, in an alternative, only a single driver (for example, only the first driver 130) may be implemented to provide all of the drive current required to drive the VCSEL 110. For example, the VCSEL 110 may be of a design where there is only one anode terminal. Alternatively, the VCSEL 110 may be of a design where there are two or more anode terminals, in which case the single driver may be coupled to any one or more of the anode terminals. Optionally, each of the driver circuits described with reference to FIGS. 1 to 7 may include two transistors for controlling a pulse emission of the VCSEL 110, arranged as described with reference to FIGS. 9 to 17b.

In a further alternative, the die 120 may comprise more than two integrated drivers arranged to drive the VCSEL 110. For example, it may comprise four drivers, each of the same design as the first driver 130 described above. These plurality of drivers may be arranged in any suitable way within the die 110, for example first and second drivers may be symmetrical to each other with reference to a first plane of symmetry, and the third and fourth drivers may be symmetrical to each other with reference to a second plane of symmetry that is perpendicular to the first plane of symmetry.

Whilst the above light source system 110 is described particularly with reference to use with ToF camera systems, the light source system 110 is not limited to this use and may be used for any other purpose.

The terms 'coupling' and 'coupled' are used throughout the present disclosure to encompass both direct electrical connections between two components/devices, and also indirect electrical coupling between two components/devices where there are one or more intermediate components/devices in the electrical coupling path between the two components/devices.

Whilst the first driver 130 is described as having a switch 134 for use in controlling the transition or switching between the charging state and emission state, it will be appreciated that the first driver 130 may be configured in any other suitable way, using any other suitable components to switch or transition the first driver 130 between a charging state, where the first capacitor 132 gradually stores charge received from a power supply and the VCSEL 110 is turned off, and an emission state where the first capacitor 132 discharges to generate the first drive current 136 to turn on the VCSEL 110. Likewise, it is not essential that a controller 430 is used to control the switching or transition of the first driver 130 between the charging state and the emission state. Any other suitable arrangement or circuit could alternatively be used for that purpose, for example a timer circuit configured to transition the first driver 130 at regular intervals, or a circuit configured to transition the first driver 130 based on the amount of charge stored on the first capacitor 132 (for example, switching to the emission state when the charge stored on the first capacitor 132 reaches a predetermined level), etc.

The capacitors 132 and 142 described above may either by integrated with the semiconductor die 120, or they may be a lateral silicon design capacitors that may be bumped bonded to a surface of the semiconductor due 120 in order to couple them to the driver IC circuitry.

The invention claimed is:

1. A laser light source system comprising:
   a laser light source;
   a first transistor device coupled to the laser light source;
   a second transistor device coupled to the laser light source, wherein the first transistor device and second transistor device are arranged such that when both the first transistor device and the second transistor device are in an on-state, a laser drive circuit is complete and a laser drive current flows through the laser light source; and
   a controller arranged to control a state of the first transistor device and a state of the second transistor device, wherein the controller is configured to control a pulse emission of light from the laser light source by:
   a) switching on, while the second transistor device is in an off-state, the first transistor device by pre-charging the first transistor device by applying a turn-on voltage to a control terminal of the first transistor device to charge a capacitance associated with the control terminal of the first transistor device and by removing the turn-on voltage applied to the control terminal of the first transistor device such that the first transistor device is held in the on-state by the capacitance associated with the control terminal of the first transistor device;
   b) after switching on the first transistor device, turning on the laser light source by switching on the second transistor device such that both the first transistor device and second transistor device are in an on-state; and
   c) after switching on the second transistor device, turning off the laser light source by switching off the first transistor device.

2. The laser light source system of claim 1, wherein the controller is configured to turn off the laser light source by switching off the first transistor device whilst the second transistor device is still in the on-state.

3. The laser light source system of claim 2, further configured to:
   d) after switching off the first transistor device, resetting the laser light source system by switching off the second transistor device such that the first transistor device and the second transistor device are both in the off-state.

4. The laser light source system of claim 1, wherein the capacitance associated with the control terminal of the first transistor device is a parasitic capacitance of the first transistor device.

5. The laser light source system of claim 1, wherein the laser light source system further comprises a pre-charge transistor for controlling the turn-on voltage to the control terminal of the first transistor device, and wherein the controller is configured to apply the turn-on voltage and remove the turn-on voltage by controlling the state of the pre-charge transistor.

6. The laser light source system of claim 1, wherein switching off the first transistor device comprises discharging the capacitance associated with the control terminal of the first transistor device.

7. The laser light source system of claim 6, further comprising a turn-off transistor for controlling the discharge of the capacitance associated with the control terminal of the first transistor device and wherein the controller is configured to discharge the capacitance associated with the control terminal of the first transistor device by controlling the state of the turn-off transistor using a turn-off control signal.

8. The laser light source system of claim 7, further comprising a cascode transistor in a discharge path of the capacitance.

9. The laser light source system of claim 1, wherein a magnitude of the turn-on voltage is greater than a magnitude of a laser drive voltage used to supply the laser drive current.

10. The laser light source system of claim 1, further comprising a bootstrap capacitor, wherein a first plate of the bootstrap capacitor is coupled to the control terminal of the first transistor device and a second plate of the bootstrap capacitor is coupled to the controller, and wherein the controller is further configured to apply, prior to switching on the second transistor device, a bootstrap voltage to the second plate of the bootstrap capacitor to increase a magnitude of a voltage at the control terminal of the first transistor device to be greater than a magnitude of the turn-on voltage.

11. The laser light source system of claim 1, wherein the controller is configured to:
   generate a first control signal for controlling the state of the first transistor device; and
   generate a second control signal for controlling the state of the second transistor device, wherein the controller is configured to control a duration of the pulse emission of light from the laser light source by setting a time difference between a change in the second control signal causing the second transistor vi to turn on and a change in the first control signal causing the first transistor device to turn off.

12. The laser light source system of claim 1, wherein the controller is configured to control the laser light source to emit the laser light pulse with a duration of less than 1 nanosecond.

13. The laser light source system of claim 1, further comprising:
   a discharge transistor coupled to the laser light source and arranged to create a discharge path approximately at a time of switching off the first transistor device, so as to discharge parasitic charge associated with the laser light source.

14. A laser light source controller for coupling to a laser driver circuit that comprises a first transistor, a second transistor and a laser light source, wherein the laser light source controller is configured to:
   output a first control signal for controlling the first transistor; and
   output a second control signal to a second transistor that is coupled to the laser light source, wherein the first transistor, second transistor and laser light source are arranged in series such that when both the first transistor and second transistor are conducting, the laser light source turns on,
   wherein the laser light source controller is configured to control a pulse emission of light from the laser light source by:
   a) setting the first transistor, while the second transistor is in a non-conducting state, to a conducting state using the first control signal, the setting including pre-charging the first transistor by applying a turn-on voltage to a control terminal of the first transistor to charge a capacitance associated with the control terminal of the first transistor and removing the turn-on voltage applied to the control terminal of the first transistor such that the first transistor is held in an on-state by the capacitance associated with the control terminal of the first transistor;

b) after setting the first transistor to the conducting state, turning on the laser light source by setting the second transistor to a conducting state using the second control signal such that both the first transistor and second transistor are conducting; and
c) after setting the second transistor to the conducting state, turning off the laser light source by setting the first transistor to a non-conducting state.

15. The laser light source controller of claim 14, wherein the first control signal is for switching the first transistor from the non-conducting state to the conducting state, and wherein the laser light source controller is further configured to:
   output a third control signal for switching the first transistor from the conducting state to the non-conducting state, wherein the laser light source controller is configured to set the first transistor to the non-conducting state using the third control signal.

16. The laser light source controller of claim 14, further configured to control a time difference between setting the second transistor to the conducting state and setting the first transistor to the non-conducting state based on a target light emission duration.

17. A method for controlling a pulse of emission of light from a laser light source comprising:
   setting a first transistor coupled in series with the laser light source to a conducting state, the setting including pre-charging the first transistor by applying a turn-on voltage to a control terminal of the first transistor to charge a capacitance associated with the control terminal of the first transistor and removing the turn-on voltage applied to the control terminal of the first transistor such that the first transistor is held in an on-state by the capacitance associated with the control terminal of the first transistor, whilst a second transistor coupled in series with the laser light source is in a non-conducting state;
   turning on the laser light source by setting the second transistor to a conducting state such that both the first transistor and second transistor are conducting; and
   turning off laser light source by setting the first transistor to a non-conducting state.

18. The method of claim 17, further comprising:
   after setting the first transistor to a non-conducting state, setting the second transistor to a non-conducting state such that the first transistor and the second transistor are both in the non-conducting state.

19. The method of claim 17, wherein a duration of the pulse of emission of light from the laser light source is set by a time difference between setting the second transistor to the conducting state and setting the first transistor to the non-conducting state.

* * * * *

UNITED STATES PATENT AND TRADEMARK OFFICE
CERTIFICATE OF CORRECTION

PATENT NO. : 11,600,966 B2
APPLICATION NO. : 17/080629
DATED : March 7, 2023
INVENTOR(S) : Hurwitz et al.

Page 1 of 1

It is certified that error appears in the above-identified patent and that said Letters Patent is hereby corrected as shown below:

In the Claims

In Column 27, Line 64, in Claim 7, after "device", insert --,--

In Column 28, Line 28, in Claim 11, delete "vi" and insert --device-- therefor

Signed and Sealed this
Fourth Day of June, 2024

Katherine Kelly Vidal
*Director of the United States Patent and Trademark Office*